United States Patent
Chao et al.

(10) Patent No.: US 11,239,154 B2
(45) Date of Patent: Feb. 1, 2022

(54) FISHBONE STRUCTURE ENHANCING SPACING WITH ADJACENT CONDUCTIVE LINE IN POWER NETWORK

(71) Applicant: TAIWAN SEMICONDUCTOR MANUFACTURING COMPANY LTD., Hsinchu (TW)

(72) Inventors: Chien-Ju Chao, New Taipei (TW); Fang-Yu Fan, Hsinchu County (TW); Yi-Chuin Tsai, Pingtung Country (TW); Kuo-Nan Yang, Hsinchu (TW); Chung-Hsing Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 237 days.

(21) Appl. No.: 14/600,619

(22) Filed: Jan. 20, 2015

(65) Prior Publication Data

US 2016/0211212 A1  Jul. 21, 2016

(51) Int. Cl.
*H01L 23/522* (2006.01)
*H01L 23/528* (2006.01)
*G06F 30/394* (2020.01)

(52) U.S. Cl.
CPC ........ *H01L 23/5226* (2013.01); *G06F 30/394* (2020.01); *H01L 23/528* (2013.01); *H01L 23/5286* (2013.01); *H01L 2924/0002* (2013.01)

(58) Field of Classification Search
CPC .............. H01L 23/5226; H01L 23/528; H01L 23/5286; H01L 23/481; H01L 23/485;
(Continued)

(56) References Cited

U.S. PATENT DOCUMENTS 5,160,995 A * 11/1992 Wada .................. H01L 23/5222
257/207
5,723,908 A * 3/1998 Fuchida ................ H01L 23/528
257/211
(Continued)

FOREIGN PATENT DOCUMENTS

JP        2011146478        7/2011
JP        2014-132679 A     7/2014
(Continued)

OTHER PUBLICATIONS

Korean Office Action With Translation for Patent Application No. 10-2015-0163906.
(Continued)

*Primary Examiner* — Jesse Y Miyoshi
(74) *Attorney, Agent, or Firm* — WPAT, P.C., Intellectual Property Attorneys; Anthony King

(57) ABSTRACT

In some embodiments, a fishbone structure in a power network includes a first conductive segment in a first conductive layer running in a first direction, a plurality of second conductive segments in a second conductive layer running in a second direction and a plurality of interlayer vias between the first conductive layer and the second conductive layer. The second direction is substantially vertical to the first direction. The plurality of second conductive segments overlap with the first conductive segment. The plurality of interlayer vias are formed at where the plurality of second conductive segments overlap with the first conductive segment. Each of the plurality of second conductive segments has a width such that the first conductive segment has a first unit spacing with a first adjacent conductive line or one of the plurality of second conductive segments has a second unit spacing with a second adjacent conductive line.

20 Claims, 22 Drawing Sheets

(58) Field of Classification Search
CPC ............... H01L 23/4855; H01L 23/522; H01L 23/5225; H01L 23/482; H01L 2027/11881
See application file for complete search history.

(56) References Cited

U.S. PATENT DOCUMENTS

| | | | | |
|---|---|---|---|---|
| 5,789,807 | A * | 8/1998 | Correale, Jr. | H01L 23/5286 257/691 |
| 6,331,733 | B1 * | 12/2001 | Or-Bach | H03K 19/17736 257/211 |
| 6,476,493 | B2 * | 11/2002 | Or-Bach | H03K 19/17736 257/210 |
| 6,586,828 | B2 * | 7/2003 | Buffet | H01L 23/5286 257/207 |
| 7,200,831 | B2 * | 4/2007 | Kitabayashi | G06F 17/5077 257/E23.151 |
| 2010/0287518 | A1 * | 11/2010 | Becker | H01L 27/092 716/123 |
| 2013/0130511 | A1 * | 5/2013 | Smayling | G06F 30/39 438/759 |
| 2013/0233608 | A1 * | 9/2013 | Feng | H01L 21/0274 174/264 |
| 2016/0126180 | A1 * | 5/2016 | Meng | H01L 23/5286 257/774 |

FOREIGN PATENT DOCUMENTS

| | | |
|---|---|---|
| JP | 2014175493 | 9/2014 |
| KR | 20050048594 | 5/2005 |

OTHER PUBLICATIONS

English abstract translation for patent JP2014175493.
English abstract translation for patent JP2011146478.
English abstract translation for patent KR20050048594.
English translation of the notice of allowance for application Korean appliction 10-2015-0163906.
Notice of allowance for Korean application 10-2015-0163906.

\* cited by examiner

FISHBONE STRUCTURE ENHANCING SPACING WITH ADJACENT CONDUCTIVE LINE IN POWER NETWORK

BACKGROUND

Typically, a power network of an integrated circuit (IC) chip includes a plurality of layers of conductive lines which are arranged as, for example, a mesh network, and a plurality of interlayer vias that interconnect different layers of conductive lines. In the mesh network, conductive lines in an upper layer such as a metal layer M7 cross over conductive lines in a lower layer such as a metal layer M2. Corresponding to where the conductive lines in the upper layer overlap with the conductive lines in the lower layer, interlayer vias and conductive segments in intermediate metal layers are disposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
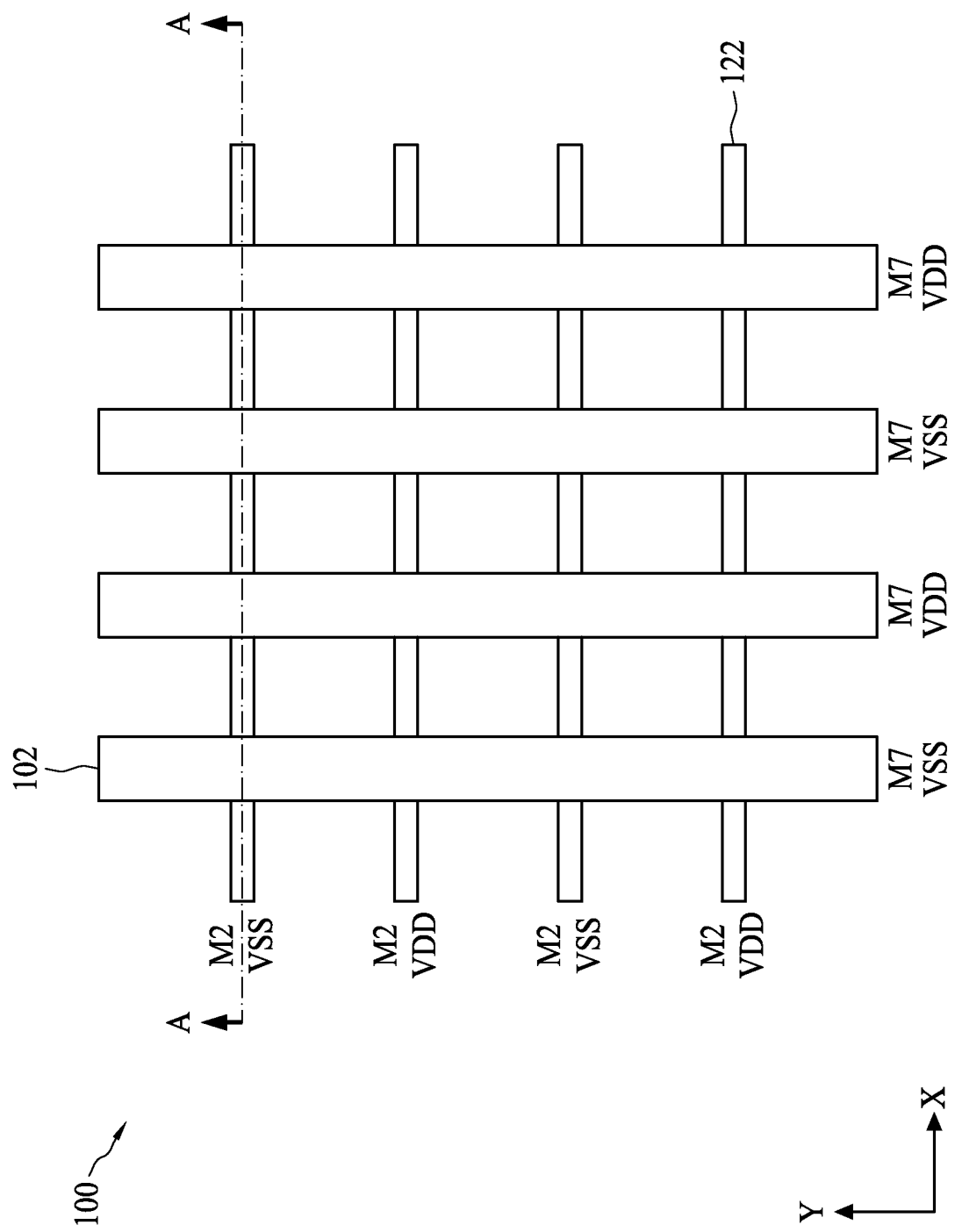
FIG. 1A is a schematic top-view diagram of a power network in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top", "bottom", "front", "back", "left", "right", "horizontal", "vertical" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Figure 1B:
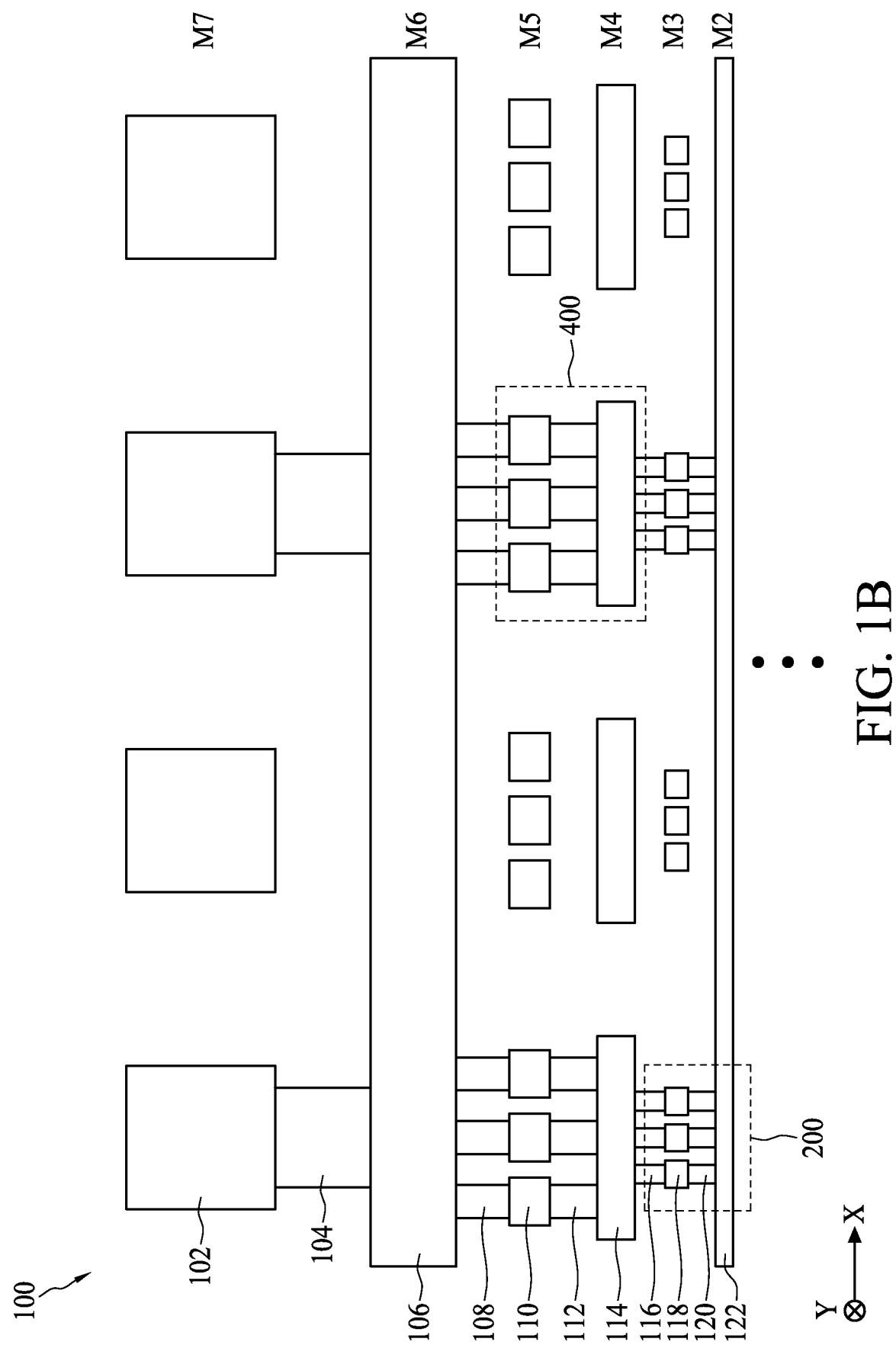
FIG. 1B is a schematic cross-sectional view diagram of the power network along line A-A' in FIG. 1A.

FIG. 1A is a schematic top-view diagram of a power network 100 in accordance with some embodiments. FIG. 1B is a schematic cross-sectional view diagram of the power network 100 along line A-A' in FIG. 1A. Referring to both FIGS. 1A and 1B, in some embodiments, the power network 100 includes a plurality of conductive lines (not shown) in a metal layer M1, a plurality of conductive lines 122 in a metal layer M2, a plurality of conductive segments 118 in a metal layer M3, a plurality of conductive segments 114 in a metal layer M4, a plurality of conductive segments 110 in a metal layer M5, a plurality of conductive lines 106 in a metal layer M6 and a plurality of conductive lines 102 in a metal layer M7. The power network 100 further includes a plurality of interlayer vias 124 (not shown) between the metal layers M1 and M2, a plurality of interlayer vias 120 between the metal layers M2 and M3, a plurality of interlayer vias 116 between the metal layers M3 and M4, a plurality of interlayer vias 112 between the metal layers M4 and M5, a plurality of interlayer vias 108 between the metal layers M5 and M6, and a plurality of interlayer vias 104 between the metal layers M6 and M7. Each layer M1, M2 . . . or M7 of the power network 100 includes alternatively arranged VDD lines and VSS lines. The interlayer vias 124, 120, 116, 112, 108 and 104 couple corresponding VDD lines in the layers M1, M2 . . . and M7, and couple corresponding VSS lines in the layers M1, M2 . . . and M7.

Referring to FIG. 1A, in some embodiments, the conductive lines 102 in the metal layer M7 are running in a Y direction. The conductive lines 122 in the metal layer M2 are running in an X direction. The X direction is substantially vertical to the Y direction. The conductive lines 102 cross over the conductive lines 122.

Referring to FIG. 1B, suppose a designer decides that the power network 100 is sufficiently dense without the complete network in the metal layers M3, M4 and M5. The conductive lines 106 in the metal layer M6 running in the X direction are formed, and interlayer vias 104 between the metal layers M7 and M6 are formed at where the conductive lines 102 in the metal layer M7 overlap with the conductive lines 106 in the metal layer M6. Further, in order to connect the conductive lines 106 in the metal layer M6 to the conductive lines 122 in the metal layer M2, the conductive segments 110, 114 and 118 in the metal layers M5, M4 and M3, respectively, and the interlayer vias 108, 112, 116 and 120 between the metal layers M6 and M5, M5 and M4, M4 and M3, and M3 and M2, respectively, are formed at locations corresponding to where the conductive lines 102 in the metal layer M7 overlap with the conductive lines 122 in the metal layer M2. The conductive segments 110 in the metal layer M5 are running in the Y direction. The conductive segments 114 in the metal layer M4 are running in the X direction. The conductive segments 118 in the metal layer M3 are running in the Y direction. In FIG. 1B, corresponding to some places where the conductive lines 102 overlap with the conductive lines 122, a fishbone structure 200 is formed by a portion of conductive segments 118, the conductive line 122 and a portion of the interlayer vias 120, and a fishbone structure 400 is formed by a portion of conductive segments 110, one of the conductive segments 114 and a portion of the interlayer vias 112.

Figure 2A:
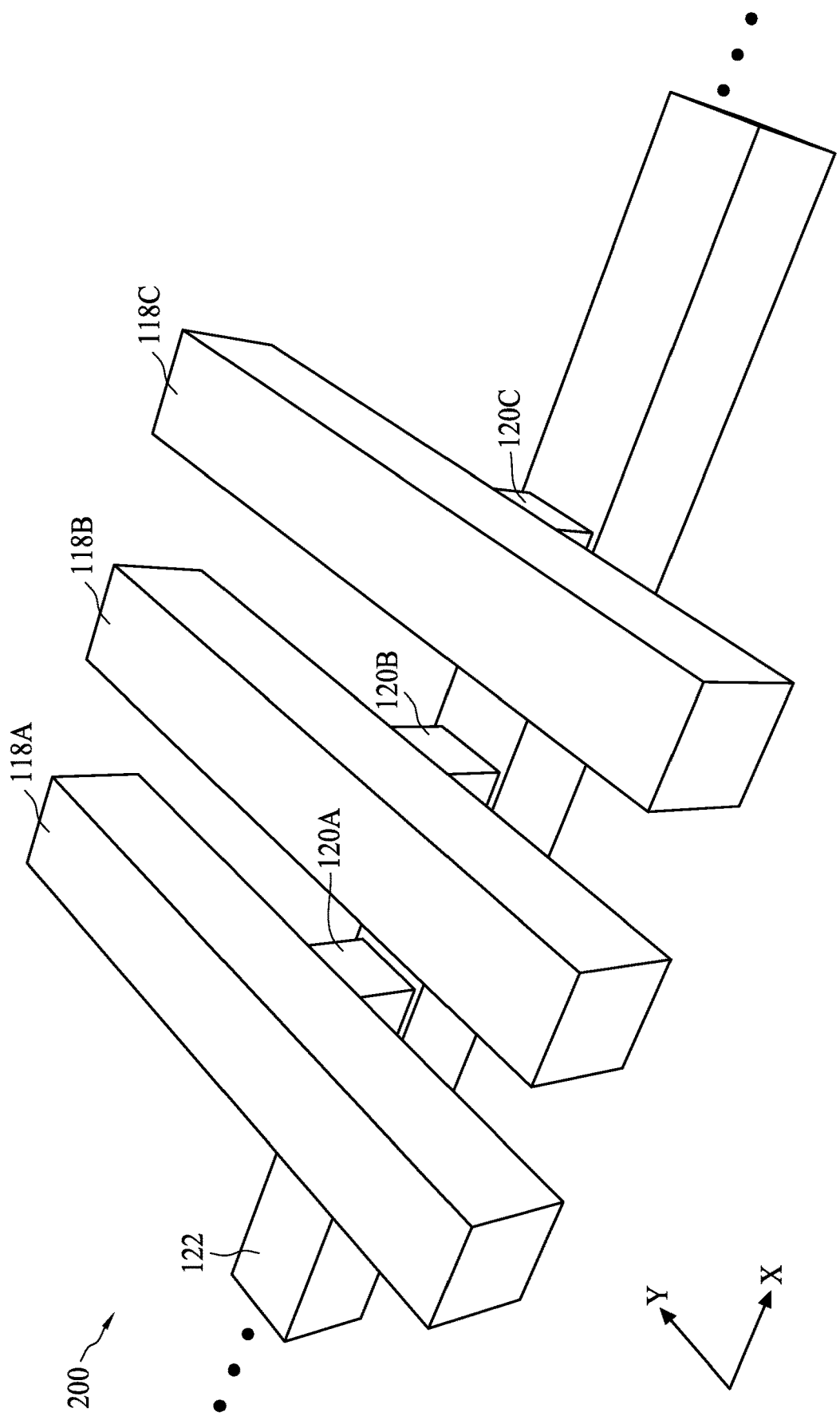
FIG. 2A is a schematic perspective-view diagram of a fishbone structure in FIG. 1B in accordance with some embodiments.

FIG. 2A is a schematic perspective-view diagram of the fishbone structure 200 in FIG. 1B in accordance with some embodiments. The fishbone structure 200 includes the conductive line 122 (only a portion is shown) in the metal layer M2 running in the X direction, the conductive segments 118A, 118B and 118C in the metal layer M3 running in the Y direction, and the interlayer vias 120A, 120B and 120C disposed at where the conductive segments 118A, 118B and 118C overlap with the conductive line 122. The conductive line 122 serves as a spine of the fishbone structure 200 and the conductive segments 118A, 118B and 118C serve as ribs of the fishbone structure 200.

Figure 2B:
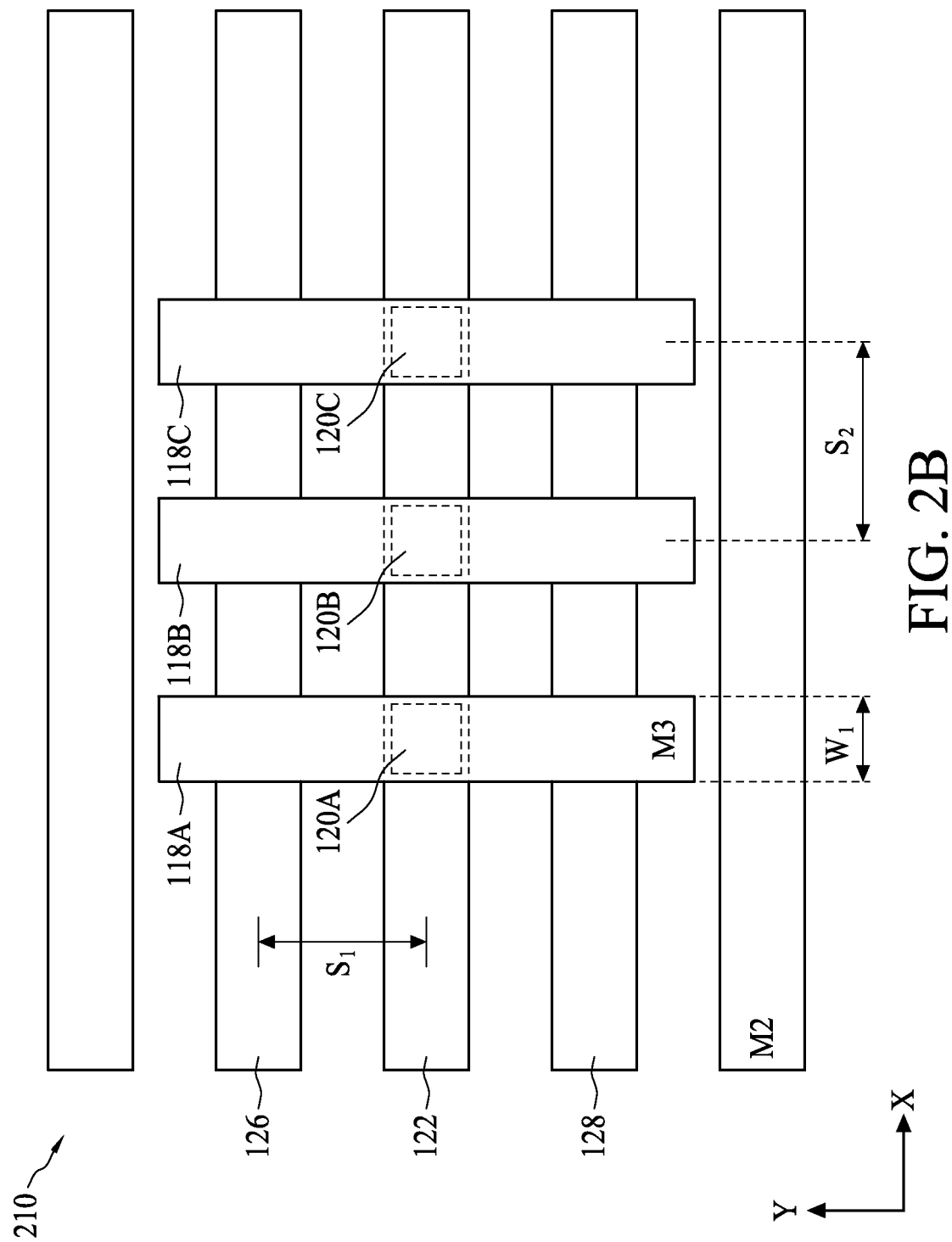
FIG. 2B is a schematic top-view diagram of a structure which includes the fishbone structure in FIG. 2A and adjacent conductive lines for which a wide metal spacing rule does not apply in accordance with some embodiments.

FIG. 2B is a schematic top-view diagram of a structure 210 which includes the fishbone structure 200 in FIG. 2A and adjacent conductive lines 126 and 128 for which a wide metal spacing rule does not apply in accordance with some embodiments. For advanced technology nodes such as 16 nm and beyond, the wide metal spacing rule requires routing tracks adjacent to a conductive line in a lower metal layer to be blocked when a conductive line or conductive segment in an upper metal layer that overlaps with the conductive line in the lower metal layer has a wide width, such as the width greater than or equal to the minimum width of the upper metal layer. For example, when a traditional powerplan structure is employed in advanced technology nodes such as 16 nm and beyond to form the connection at where the metal line 102 in the metal layer M7 is overlapped with the metal line 122 in the metal layer M2 as shown in FIG. 1B, routing tracks at where the conductive lines 126 and 128 reside are blocked. In present embodiments, each of the conductive segments 118A, 118B and 118C in the metal layer M3 has a width $W_1$ such that the conductive line 122 has a unit spacing $S_1$ with adjacent conductive lines 126 and 128 in the metal layer M2. In other words, the width $W_1$ of the conductive segments 118A, 118B and 118C does not cause the wide metal spacing rule to be triggered during routing, and therefore, the conductive lines 126 and 128 that has the unit spacing $S_1$ with the conductive line 122 can be formed. In some embodiments, the width $W_1$ is the minimum dimension of the layers with VIA layouts. The interlayer vias 120A, 120B and 120C are formed at where the conductive segments 118A, 118B and 118C overlap with the conductive line 122, respectively.

Figure 3:
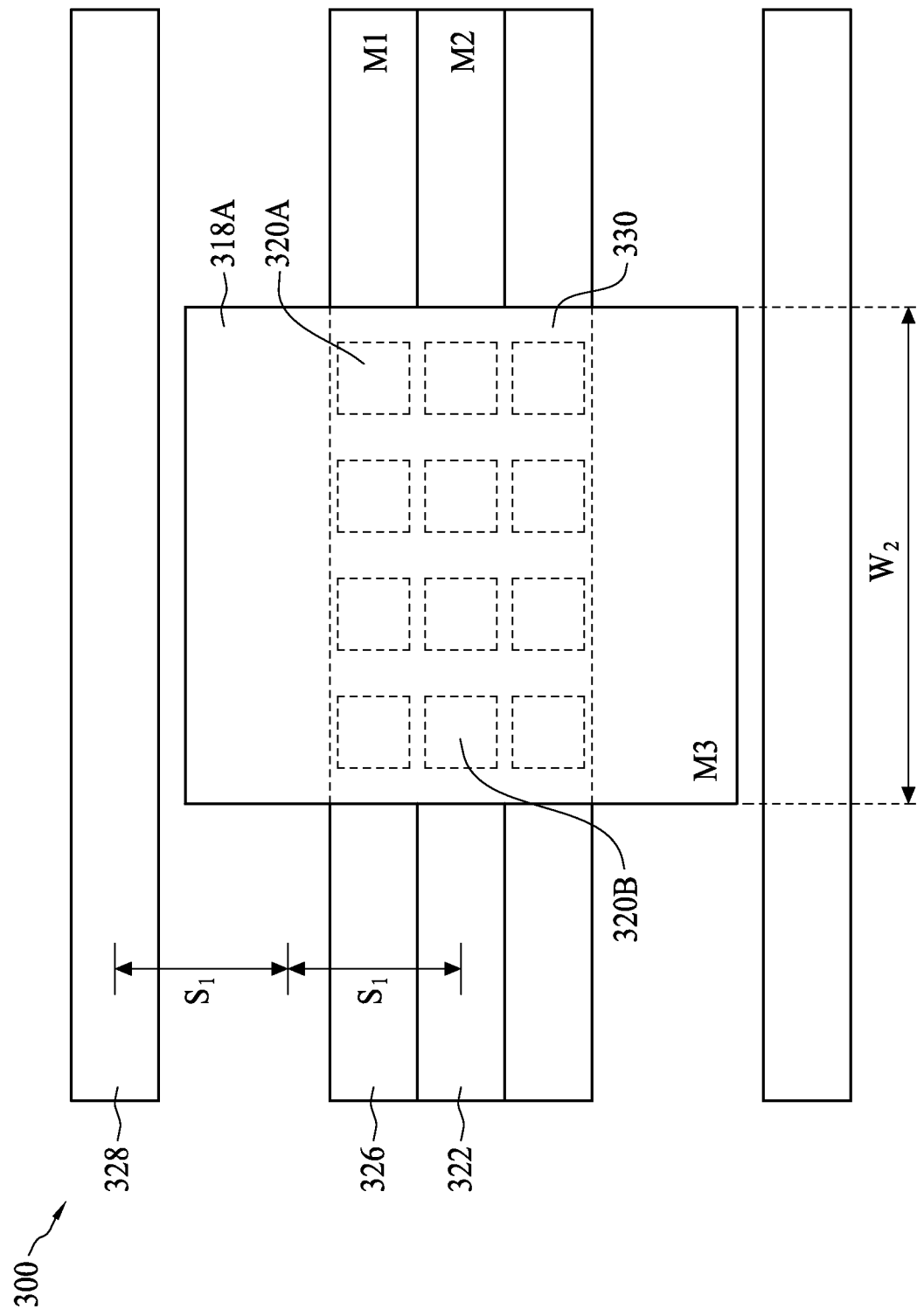
FIG. 3 is a schematic top-view diagram of a structure for which the wide metal spacing rule is applied.

In comparison to FIG. 2B, FIG. 3 is a schematic top-view diagram of a structure 300 for which the wide metal spacing rule is applied. The structure 300 includes a conductive line 326 in the metal layer M1, conductive lines 322 and 328 in a metal layer M2, a conductive line 318 in the metal layer M3, and interlayer vias 320A and 320B between the metal layers M1 and M3, and M2 and M3, respectively. In the advanced technology nodes, the conductive line 326 in the metal layer M1 and the conductive line 322 in the metal layer M2 are in parallel to form double rails that increase a current flowing therethrough. As shown in FIG. 3, the conductive line 326 in the metal layer M1 has a wider width than the conductive line 322 in the metal layer M2. The widths of the conductive lines increase as the layers progress from a lower metal layer such as the metal layer M2 to an upper metal layer such as the metal layer M7. When a connection between the metal layer M7 and the metal layer M1 is generated during routing, the conductive line in the metal layer M7 is projected to the conductive line 326 in the metal layer M1 and the conductive line 322 in the metal layer M2 to determine a width of conductive segment in an intermediate layer and an area in the intermediate layer where interlayer vias will be disposed. For example, as the conductive line M7 is projected to the conductive line 326 in the meta layer M1 and the conductive line 322 in the metal layer M2, the conductive segment 318 in the metal layer M3 is determined to have a wide width $W_2$, and the interlayer vias 320A and 320B will be disposed within an area 330 where the conductive segment 318 in the metal layer M3 overlap with the conductive line 326 in the metal layer M1. During routing, because of the wide width $W_2$ of the conductive segment 318 in the metal layer M3, routing tracks adjacent to the conductive line 322 in the metal layer M2 are blocked for being subjected to the wide metal spacing rule. As a result, in the metal layer M2, the adjacent conductive line 328 is separated from the conductive line 322 by two unit spacings $S_1$.

Referring to FIG. 2B, because the routing resources adjacent to the conductive line 122 in the metal layer M2 are available for use, fewer routing detours due to insufficient routing resources will happen during generation of the signal lines. Therefore, performance and area of the chip on which the power network 100 (shown in FIG. 1A) is configured will be improved.

Figure 4A:
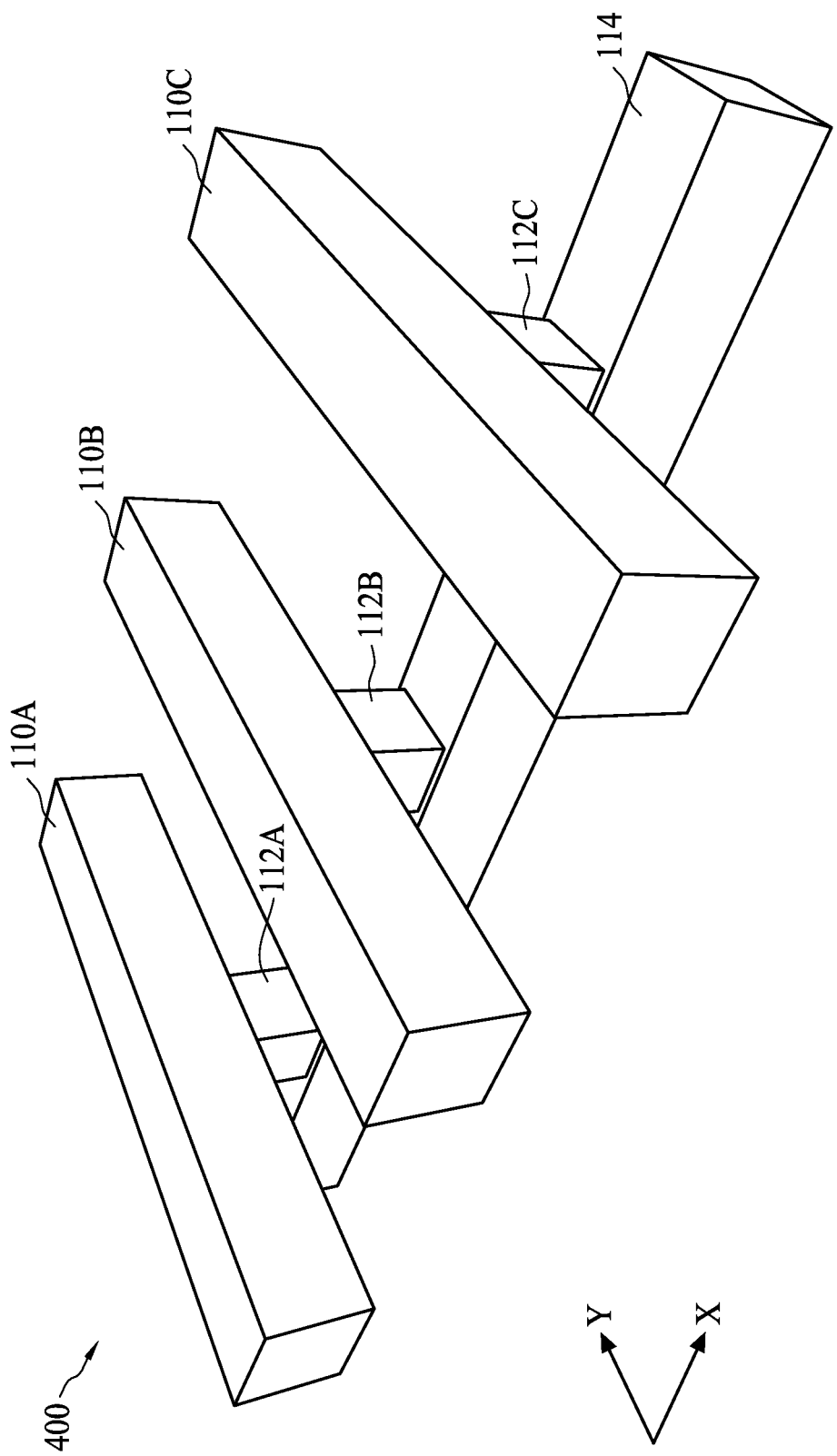
FIG. 4A is a schematic perspective-view diagram of a fishbone structure in FIG. 1B in accordance with some embodiments.

FIG. 4A is a schematic perspective-view diagram of the fishbone structure 400 in FIG. 1B in accordance with some embodiments. The fishbone structure 400 includes the conductive segment 114 in the metal layer M4 running in the X direction, the conductive segments 110A, 110B and 110C in the metal layer M5 running in the Y direction, and the interlayer vias 112A, 112B and 112C disposed at where the conductive segments 110A, 110B and 110C overlap with the conductive segment 114. The conductive segment 114 serves as a spine of the fishbone structure 400 and the conductive segments 110A, 110B and 110C serve as ribs of the fishbone structure 400.

Figure 4B:
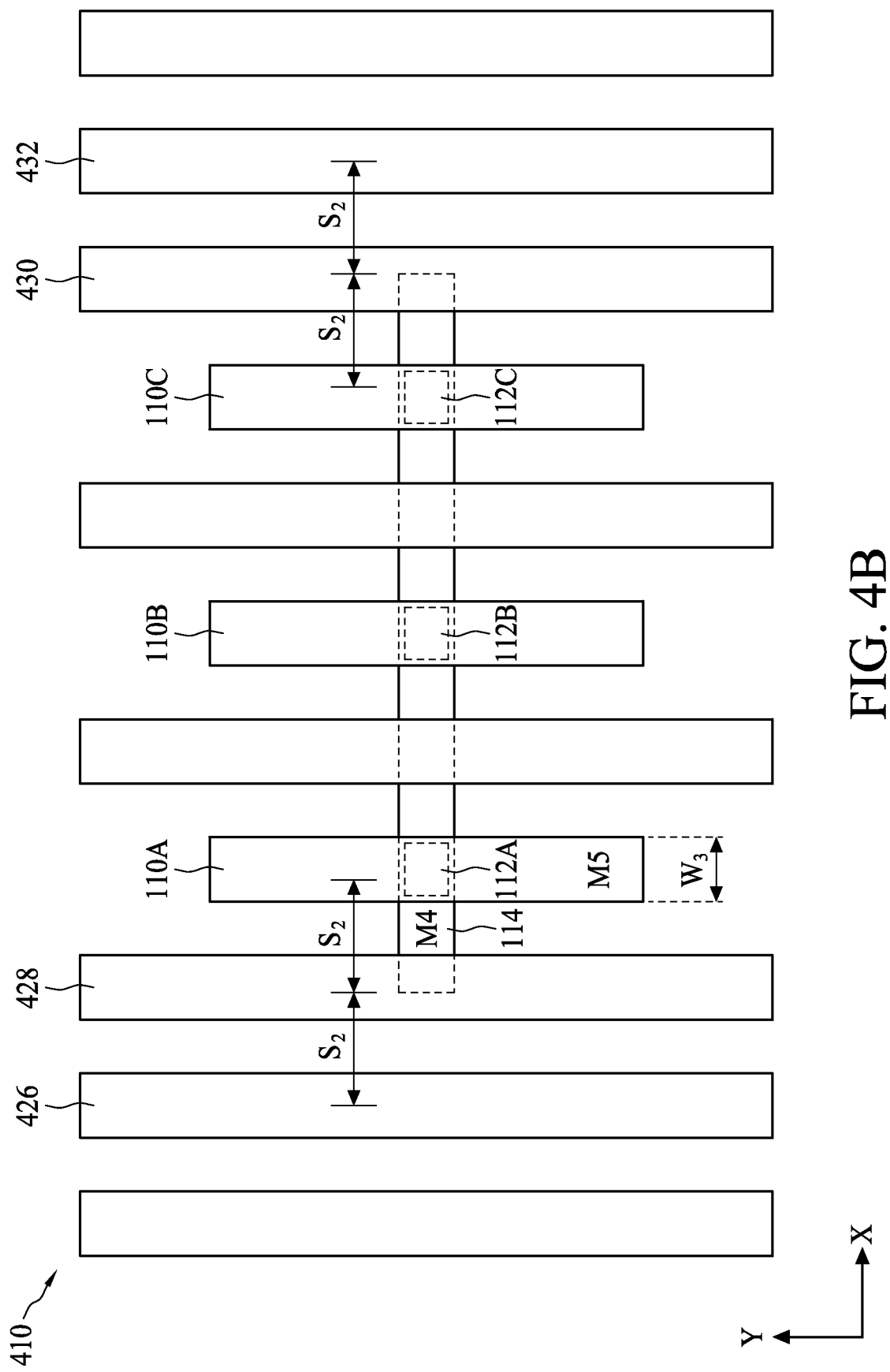
FIG. 4B is a schematic top-view diagram of a structure which includes the fishbone structure in FIG. 4A and adjacent conductive lines for which the wide metal spacing rule triggered by non-prefer direction routing does not apply in accordance with some embodiments.

FIG. 4B is a schematic top-view diagram of a structure 410 which includes the fishbone structure 400 in FIG. 4A and adjacent conductive lines 426, 428, 430 and 432 for which the wide metal spacing rule triggered by non-prefer direction routing does not apply in accordance with some embodiments. For advanced technology node, the wide metal spacing rule further requires several routing tracks adjacent to a conductive line or segment in a metal layer to be blocked when the conductive line or segment in the metal layer has a wide width. The wide metal lines on non-prefer direction induces larger spacing than the metal lines on prefer direction. Also, in advanced technology nodes, a width of the conductive line or segment is defined to be a dimension of the conductive line or segment along a non-preferred direction of routing. In the present embodiments, each of the conductive segments 110A, 110B and 110C in the metal layer M5 are running in the Y direction, which is the preferred direction of the metal layer M5. A width $W_3$ of each of the conductive segments 110A, 110B and 110C is along a non-preferred direction of the metal layer M5, which is the X direction. Because the conductive segment 110A, 110B or 110C are routed in the prefer direction, the width $W_3$ is along the shorter side of the conductive segment 110A, 110B, or 110C. In this way, the wide metal spacing rule does not apply. As a result, the two conductive lines 426 and 428 that have two unit spacings $S_2$ and one unit spacing $S_2$ with the conductive segment 110A, respectively, and two conductive lines 430 and 432 that has one unit spacing $S_2$ and two unit spacings $S_2$ with the conductive segment 110C, respectively, can be formed. The interlayer vias 112A, 112B and 112C are formed at where the conductive segments 110A, 110B and 110C overlap with the conductive segment 114, respectively.

Figure 5:
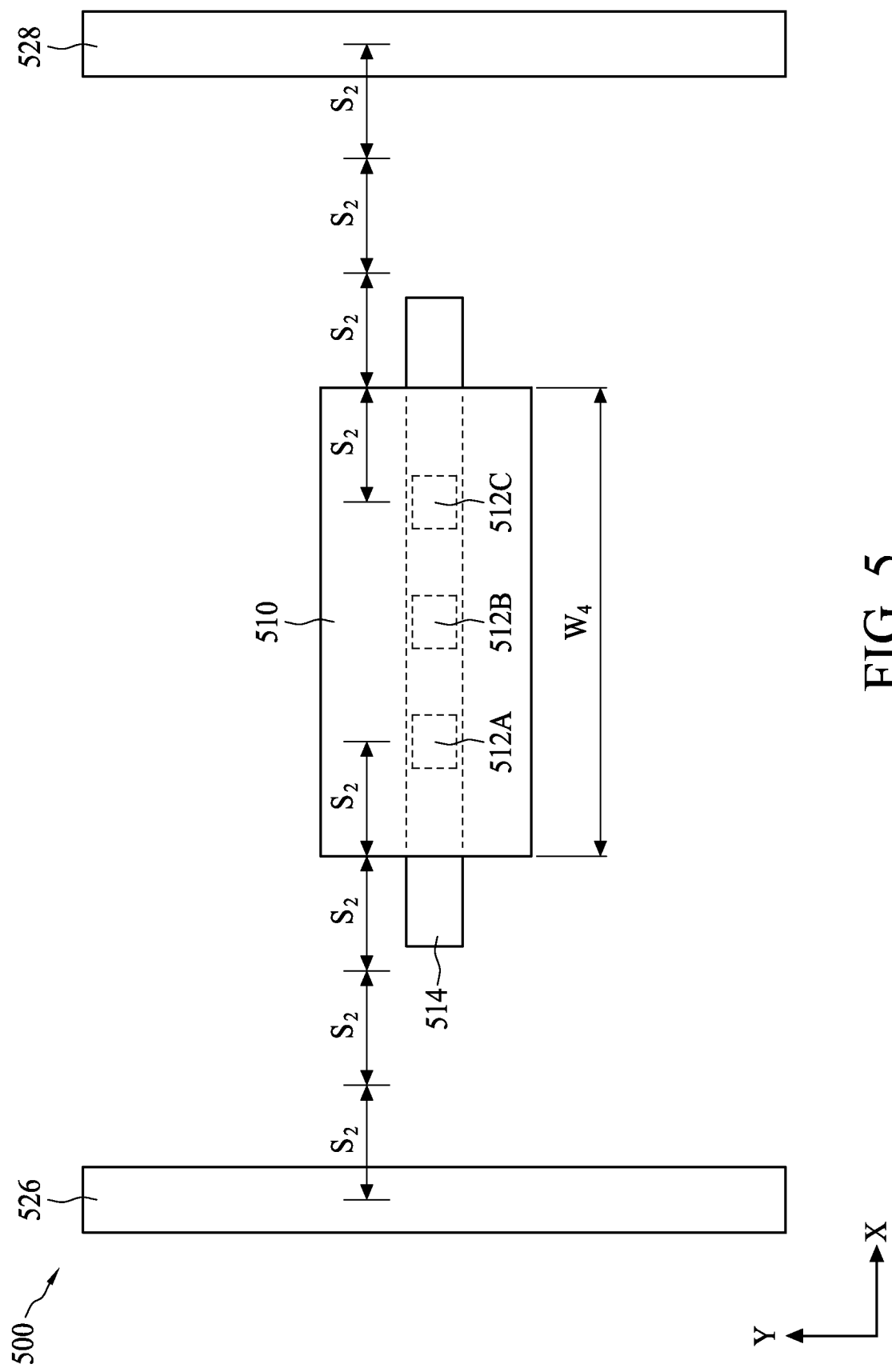
FIG. 5 is a schematic top-view diagram of a structure for which the wide metal spacing rule is triggered by non-prefer direction routing.

In comparison to FIG. 4B, FIG. 5 is a schematic top-view diagram of a structure 500 for which the wide metal spacing rule is triggered by non-prefer direction routing. The structure 500 includes a conductive segment 514 in the metal layer M4, a conductive segment 510 in the metal layer M5 and interlayer vias 512A, 512B and 512C between the metal layers M4 and M5. When a connection between the metal layer M7 and the metal layer M2 is generated during routing, the conductive line in the metal layer M7 is projected to the conductive line in the metal layer M1 and the conductive line in the metal layer M2. Because of the wider width of the metal layer M7, projection of the metal layer M7 can cause a conductive segment in a lower metal layer such as the metal layer M5 to be routed in the non-prefer direction. In FIG. 5, the prefer direction and the non-prefer direction of the metal layer M5 is the Y direction and the X direction, respectively. The conductive segment 510 in the metal layer M5 is routed in the non-prefer direction. A width $W_4$ of the conductive segment 510 is along the non-prefer direction of the metal layer M5 and is therefore a longer side of the conductive segment 510. Therefore, due to the wide metal spacing rule, the interlayer via 512A has four unit spacings $S_2$ with an adjacent conductive line 526, and the interlayer via 512C has four unit spacings $S_2$ with an adjacent conductive line 528. In other words, on both sides of the conductive line 510, two routing tracks are blocked.

Referring to FIG. 4B, because the routing resources adjacent to the conductive segments 110A and 110C in the metal layer M5 are available for use, fewer routing detours due to insufficient routing resources will happen during generation of signal line. Therefore, performance and area of the chip on which the power network 100 (shown in FIG. 1A) will be improved.

Figure 6:
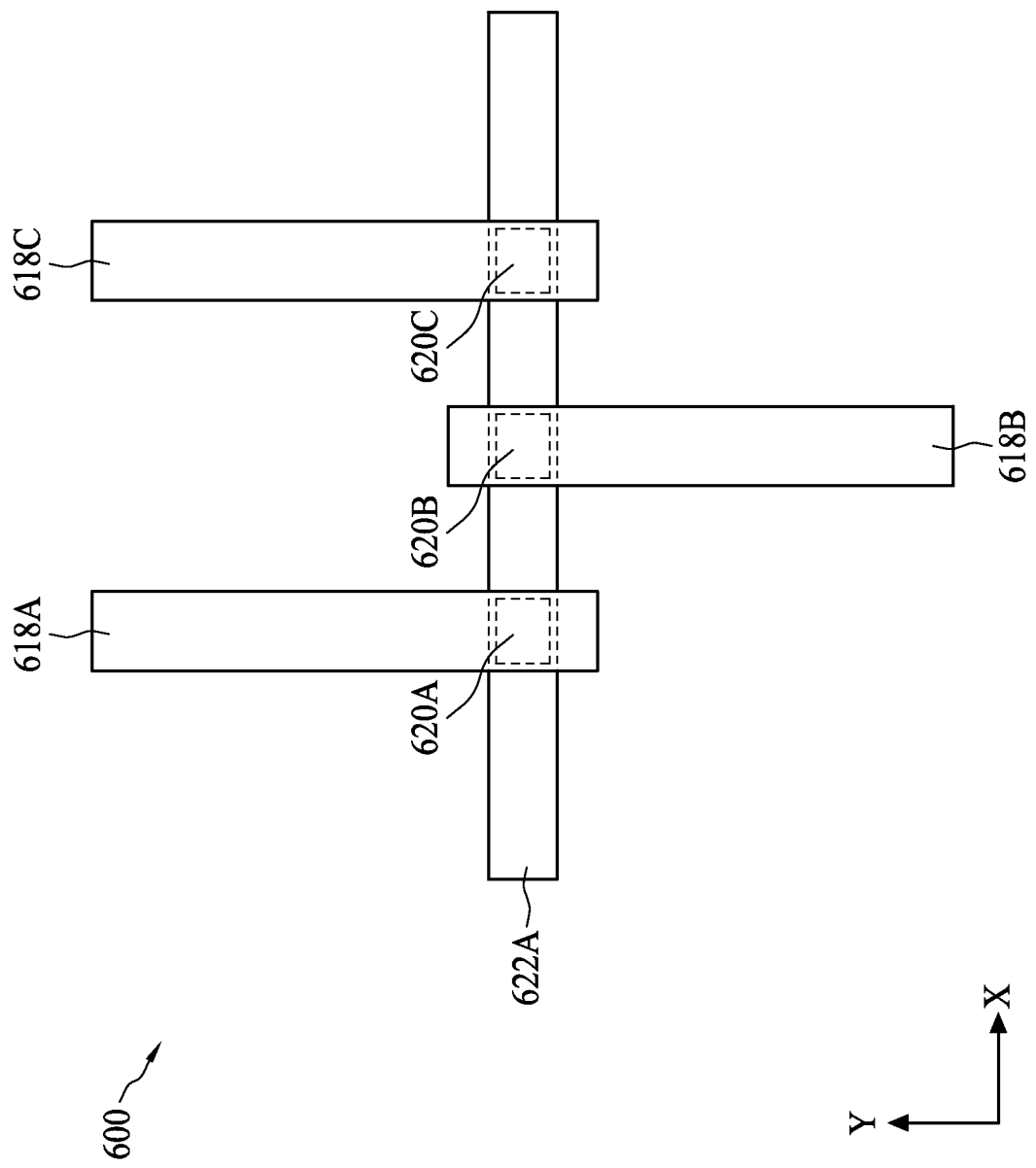
FIG. 6 is a schematic top-view diagram of a staggered fishbone structure in accordance with some embodiments.

FIG. 6 is a schematic top-view diagram of a staggered fishbone structure 600 in accordance with some embodiments. Compared to the fishbone structure 200 which has aligned conductive segments 118A, 118B and 118C shown in FIG. 2A and elements of which also shown in FIG. 2B, the staggered fishbone structure 600 has conductive segments 618A, 618B and 618C which are arranged in a staggered manner with respect to a conductive line 622A. Interlayer vias 620A, 620B and 620C are disposed between the conductive segments 618A, 618B and 618C in the metal layer M3 and the conductive line 622A in the metal layer M2, respectively. Compared to the interlayer vias 120A, 120B and 120C which are located at centers of the conductive segments 118A, 118B and 118C, the interlayer via 620A is located at a right portion of the conductive segment 618A, the interlayer via 620B is located at a left portion of the conductive segment 618B and the interlayer via 620C is located at a right portion of the conductive segment 618C when viewing along the X direction.

Figure 7:
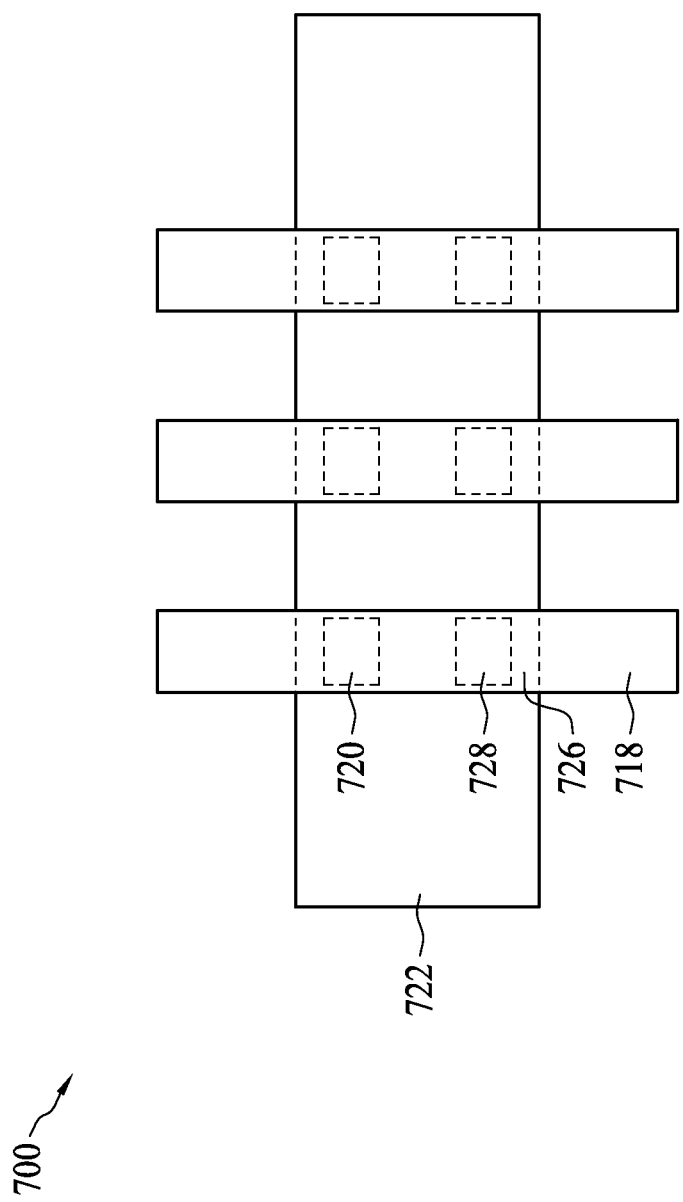
FIG. 7 is a schematic top-view diagram of a fishbone structure with a thickened spine in accordance with some embodiments.

FIG. 7 is a schematic top-view diagram of a fishbone structure 700 with a thickened spine in accordance with some embodiments. The fishbone structure 700 includes the conductive line 722 in the metal layer M2 which serves as a spine of the fishbone structure 700 and the conductive segments 718 in the metal layer M3 which serve as ribs of the fishbone structure 700. The fishbone structure 700 further includes interlayer vias 720 and 728 for connecting the conductive line 722 to the conductive segments 718. Compared to the spine of the fishbone structure 200, the conductive line 122, shown in FIGS. 2A and 2B, the spine of the fishbone structure 700, the conductive line 722, is thickened. Therefore, areas 726 where the conductive segments 718 overlap with the conductive line 722 are enlarged and the number of interlayer vias 720 and 728 disposed at each area 726 is increased. In some embodiments, each of the interlayer vias 720 and 728 has a square shape.

Figure 8:
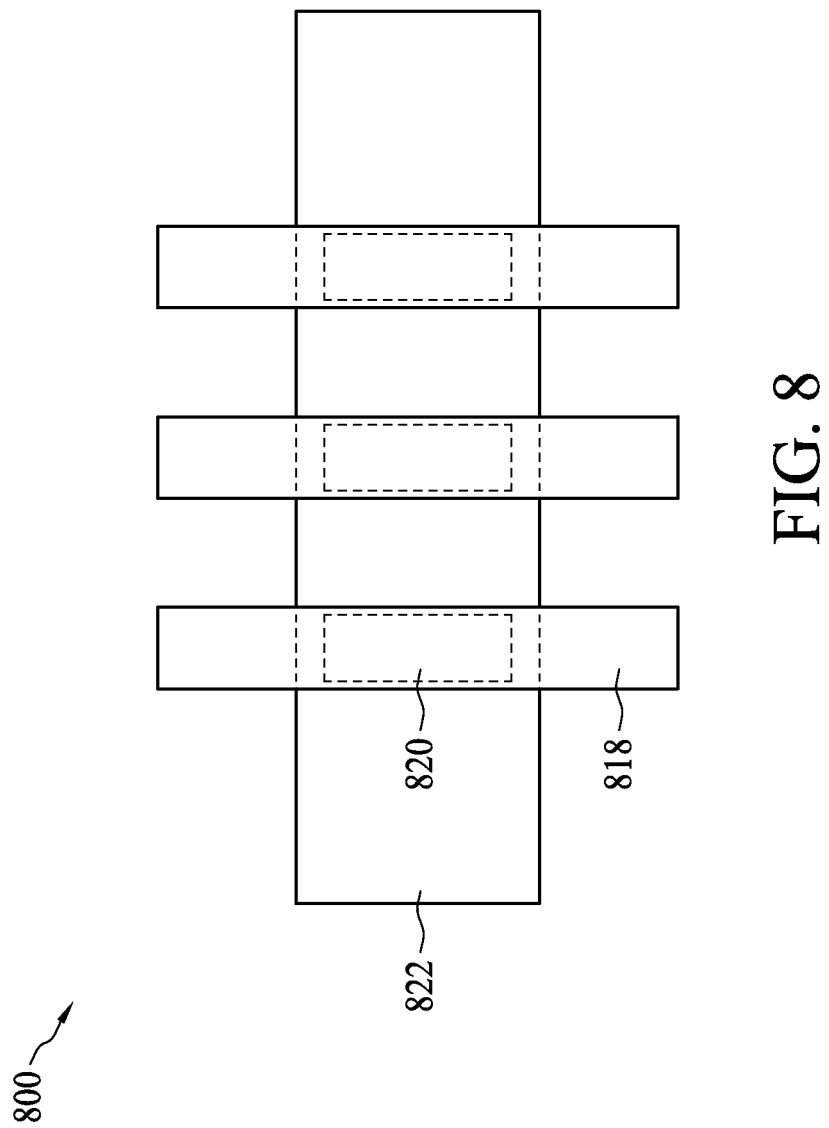
FIG. 8 is a schematic top-view diagram of a fishbone structure with a thickened spine in accordance with other embodiments.

FIG. 8 is a schematic top-view diagram of a fishbone structure 800 with a thickened spine in accordance with other embodiments. Compared to the fishbone structure 700 in FIG. 7, the fishbone structure 800 has interlayer vias 820 each of which are of a rectangular shape. The fishbone structure 800 includes the conductive line 822 in the metal layer M2 which serves as a spine of the fishbone structure 800 and the conductive segments 818 in the metal layer M3 which serve as ribs of the fishbone structure 800. The fishbone structure 800 further includes interlayer vias 820 for connecting the conductive line 822 to the conductive segments 818.

Figure 9:
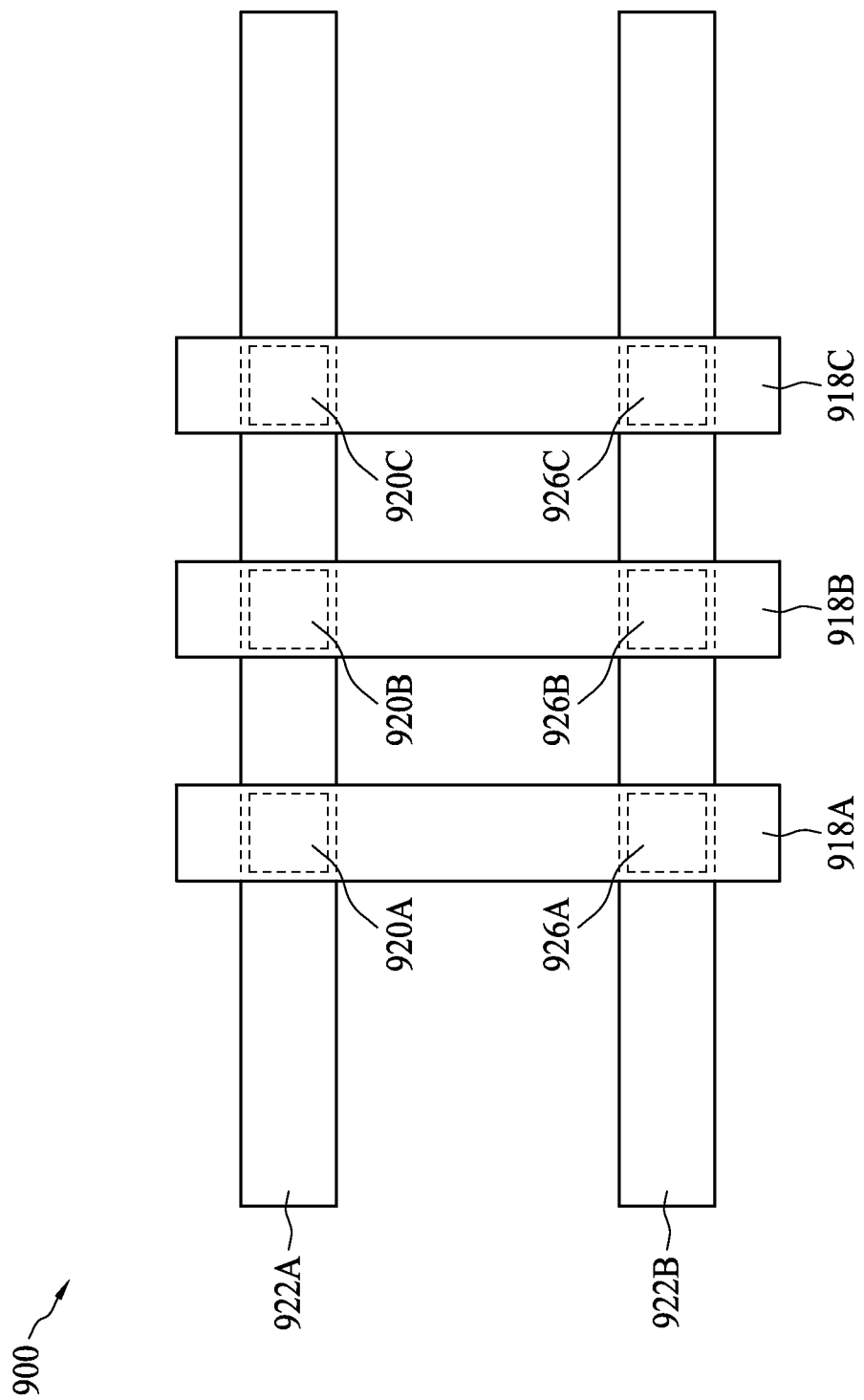
FIG. 9 is a schematic top-view diagram of a fishbone structure with multi-rows of spine in accordance with some embodiments.

FIG. 9 is a schematic top-view diagram of a fishbone structure 900 with multi-rows of spine in accordance with some embodiments. Compared to the fishbone structure 200 which has one row of spine, the conductive line 122, shown in FIG. 2A, and elements of which also shown in FIG. 2B, the fishbone structure 900 has two rows of spine, the conductive lines 922A and 922B. The fishbone structure 900 includes the conductive lines 922A and 922B in the metal layer M2 which serve as a first spine and a second spine of the fishbone structure 900, respectively, and the conductive segments 918A, 918B and 918C in the metal layer M3 which serves as ribs of the fishbone structure 900. The fishbone structure 900 further includes interlayer vias 920A, 920B and 920C for connecting the conductive line 922A to the conductive segments 918A, 918B and 918C, and interlayer vias 926A, 926B and 926C for connecting the conductive line 922B to the conductive segments 918A, 918B and 918C.

Figure 10:
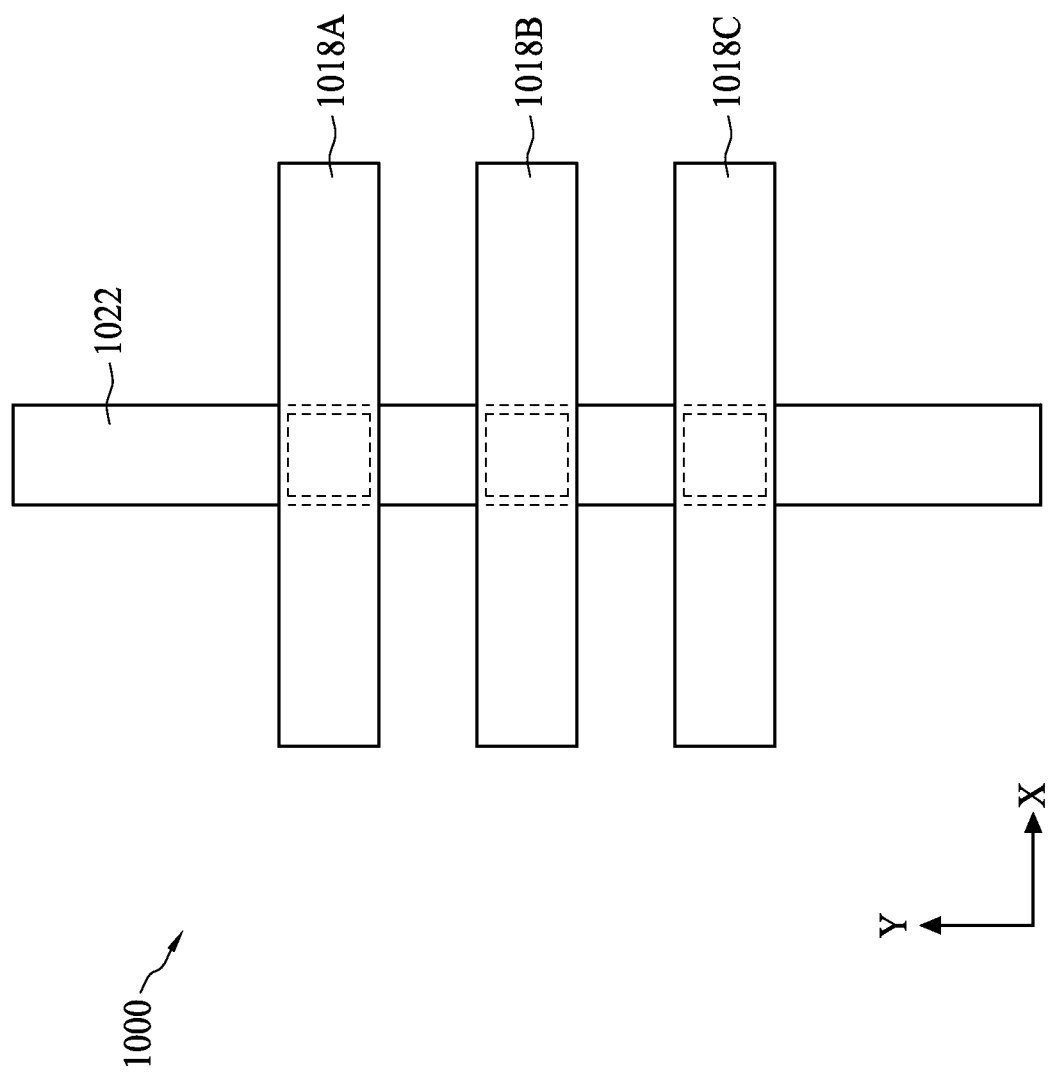
FIG. 10 is a schematic top-view diagram of a fishbone structure that has a rotated orientation in accordance with some embodiments.

FIG. 10 is a schematic top-view diagram of a fishbone structure 1000 that has a rotated orientation in accordance with some embodiments. Compared to the fishbone structure 200 that has the conductive line 122 running in the X direction and the conductive segments 118A, 118B and 118C running in the Y direction shown in FIG. 2A and elements of which also shown in FIG. 2B, the fishbone structure 1000 has a conductive line 1022 running in the Y direction and conductive segments 1018A, 1018B and 1018C running in the X direction. Therefore, the fishbone structure 1000 has the orientation which is rotated by 90° from the orientation of the fishbone structure 200.

Figure 11:
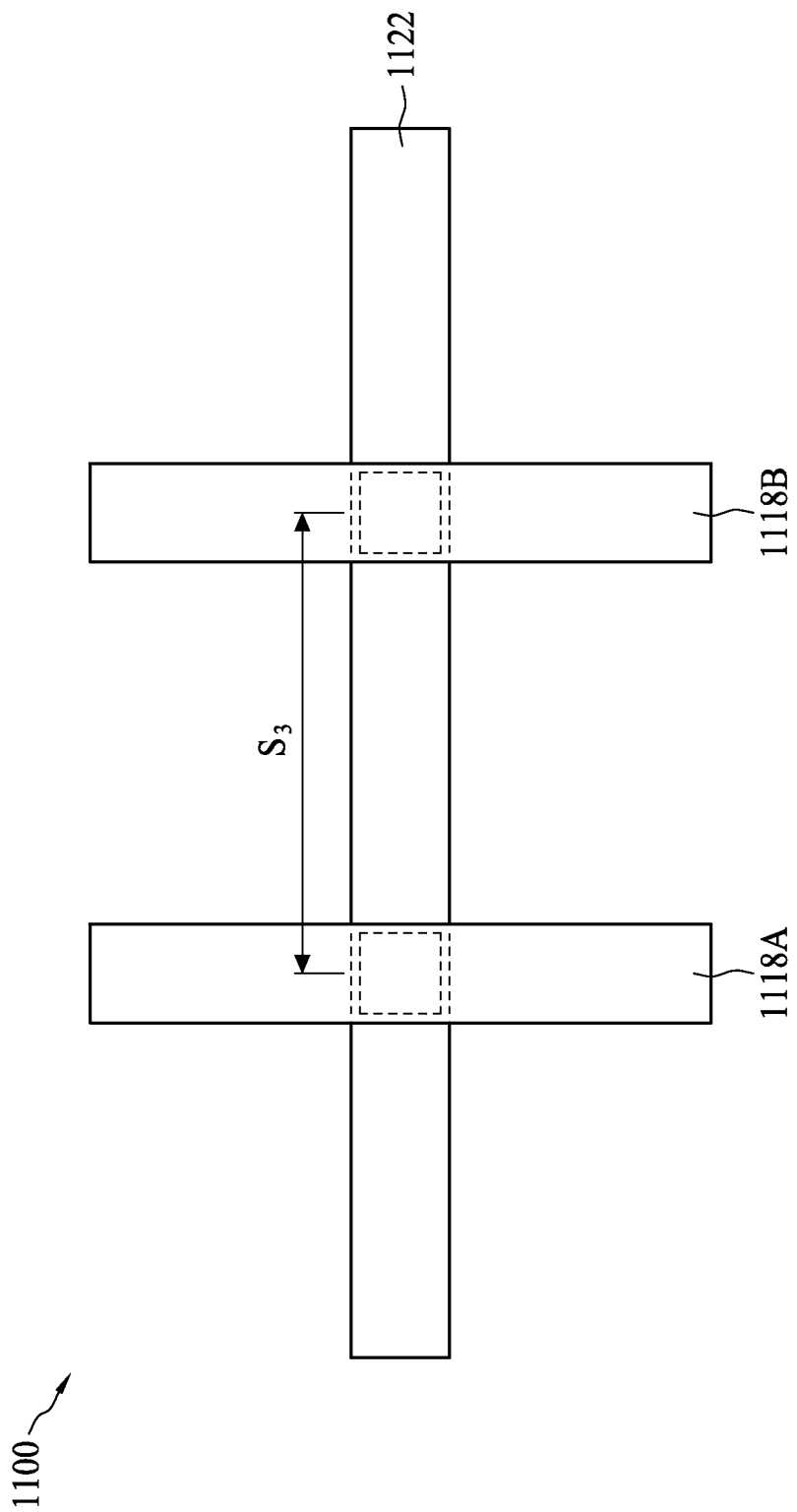
FIG. 11 is a schematic top-view diagram of a fishbone structure that has a wider spacing between conductive segments in the metal layer M3 in accordance with some embodiments.

FIG. 11 is a schematic top-view diagram of a fishbone structure 1100 that has a wider spacing $S_3$ between conductive segments 1118A and 1118B in the metal layer M3 in accordance with some embodiments. Compared to the conductive segments 118A, 118B and 118C of the fishbone structure 200 (labeled in FIG. 2A) that are separated by the spacing $S_2$ as shown in FIG. 2B, an adjacent pair of conductive segments 1118A and 1118B in the fish bone structure 1100 are separated by the spacing $S_3$ which is larger than the spacing $S_2$.

Figure 12:
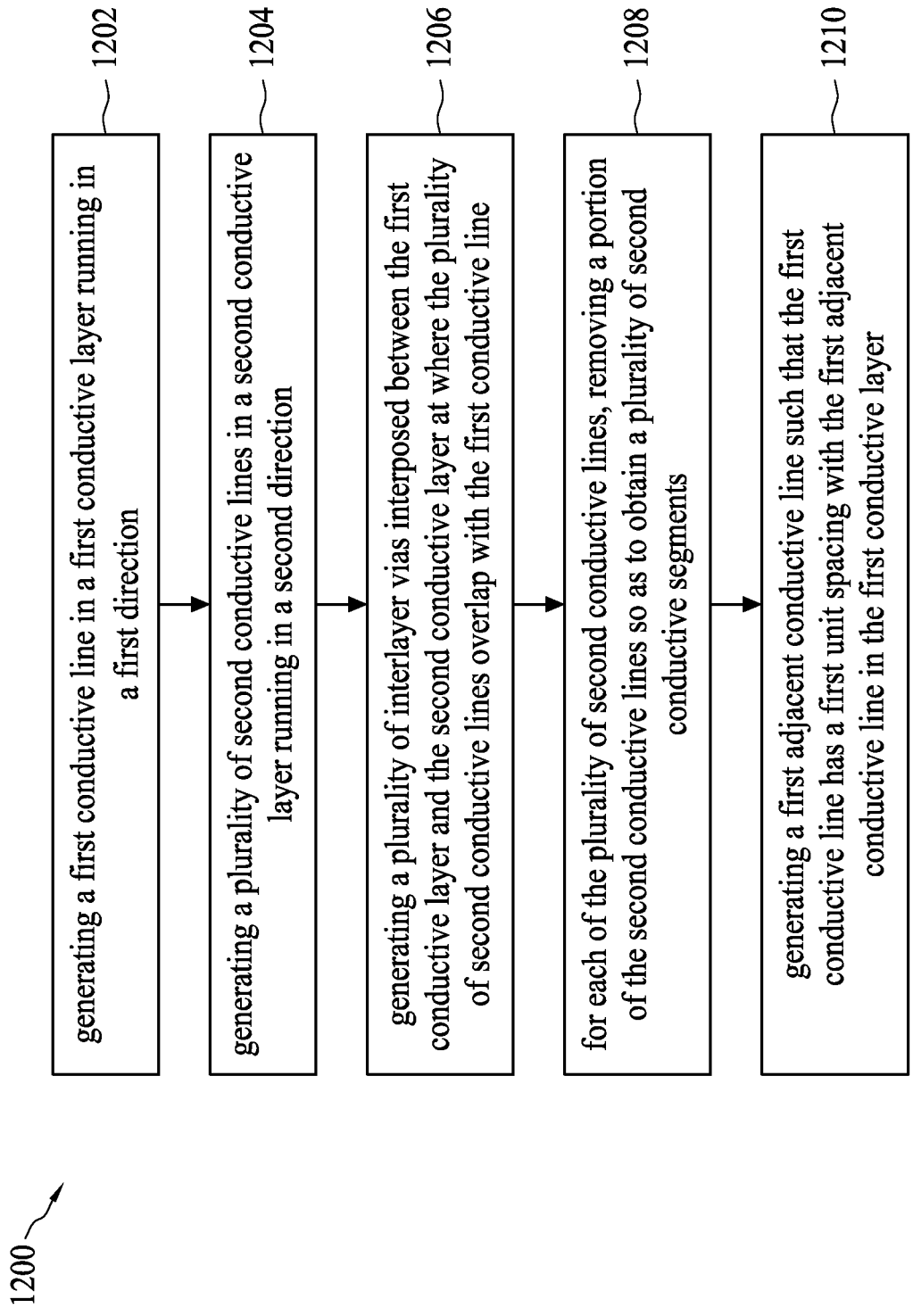
FIG. 12 is a flow diagram of a method for generating a structure in FIG. 2B that includes the fishbone structure in FIG. 2A in accordance with some embodiments.

FIG. 12 is a flow diagram of a method 1200 for generating a structure 210 in FIG. 2B that includes the fishbone structure 200 in FIG. 2A in accordance with some embodiments. In operation 1202, a first conductive line in a first conductive layer running in a first direction is generated. In operation 1204, a plurality of second conductive lines in a second conductive layer running in a second direction are generated. In operation 1206, a plurality of interlayer vias interposed between the first conductive layer and the second conductive layer are generated at where the plurality of second conductive lines overlap with the first conductive line. In operation 1208, for each of the plurality of second conductive lines, a portion of the second conductive line is removed to obtain a plurality of second conductive segments. In operation 1210, a first adjacent conductive line is generated such that the first conductive line has a first unit spacing with the first adjacent conductive line in the first conductive layer.

Figure 13A:
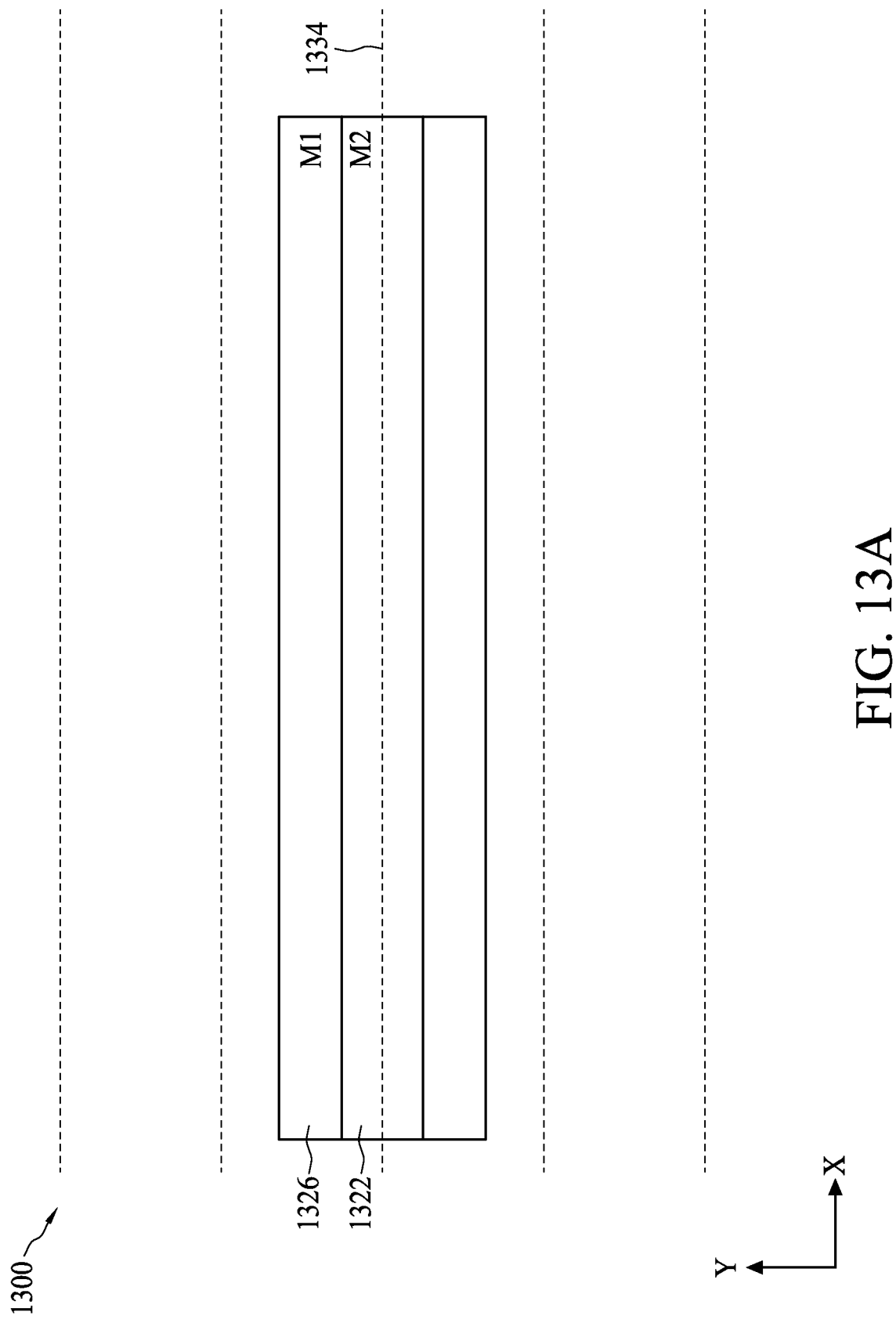
FIGS. 13A to 13F are schematic top-view diagrams of layouts illustrating operations for generating the structure in FIG. 2B that includes the fishbone structure in FIG. 2A in accordance with some embodiments.

FIGS. 13A to 13F are schematic top-view diagrams of layouts 1300, 1310, . . . and 1350 illustrating operations for generating the structure 210 in FIG. 2B that includes the fishbone structure 200 in FIG. 2A in accordance with some embodiments. Referring to FIG. 12 and FIG. 13A, in operation 1202, a first conductive line 1322 in the first conductive layer M2 running in a first direction, the X direction, is generated. During a routing process for the power network 100 in FIG. 1A, conductive lines such as a conductive line 1326 in the metal layer M1 running in the X direction is first generated. A routing track 1332 in the metal layer M2 is in parallel and aligned to the conductive line 1326 in the metal layer M1. Then, the conductive line 1322 in the metal layer M2 running in the X direction is routed along the routing track 1334. A width of the conductive line 1322 in the metal layer M2 is smaller than that of the conductive line 1324 in the metal layer M1. The conductive line 1326 and the conductive line 1322 form double rails.

Figure 13B:
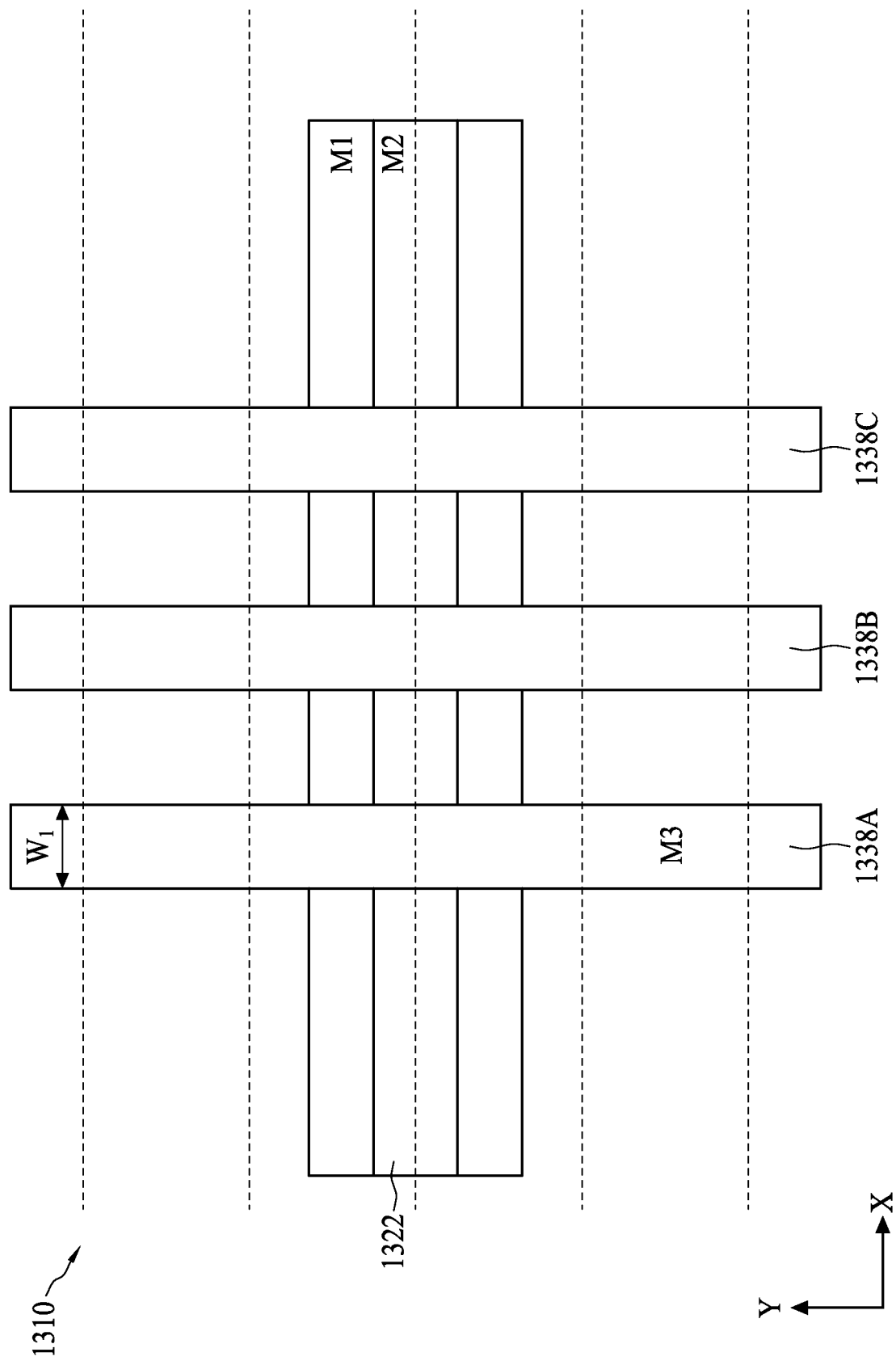

Referring to FIG. 12 and FIG. 13B, in operation 1204, a plurality of conductive lines 1338A, 1338B and 1338C in the second conductive layer M3 running in a second direction, the Y direction, are generated. Suppose the designer decides that the power network is sufficiently dense without the metal layer M3. Compared to some approaches illustratively shown in FIG. 3 that generates the conductive segment 318 in the metal layer M3 when the conductive line in the metal layer M7 is projected to the conductive line 326 in the metal layer M1 and the conductive line 322 in the metal layer M2, the conductive lines 1338A, 1338B and 1338C are generated before layers such as M4, M5 . . . and M7 upper than the metal layer M3 are generated. In this way, a width $W_1$ of each of the conductive lines 1338A, 1338B and 1338C is not determined by the shape of the conductive line in the metal layer M7 projected to the conductive line 1326 in the metal layer M1 and the conductive line 1322 in the metal layer M2, and can be decreased to, for example, the minimum width.

Figure 13C:
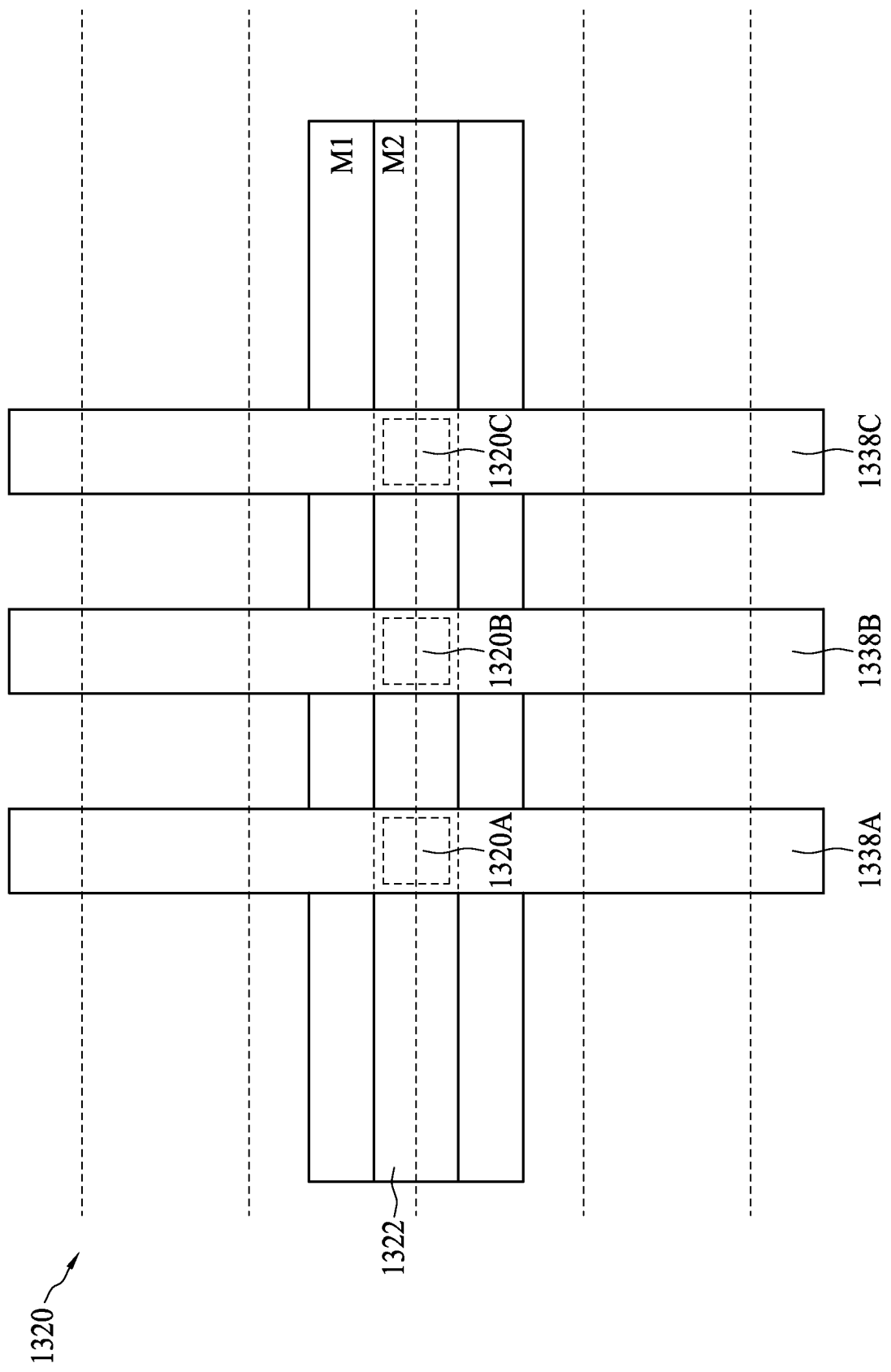

Referring to FIG. 12 and FIG. 13C, in operation 1206, a plurality of interlayer vias 1320A, 1320B and 1320C interposed between the first conductive layer M2 and the second conductive layer M3 are generated at where the plurality of second conductive lines 1338A, 1338B and 1338C overlap with the first conductive line 1322. Compared to some approaches illustratively shown in FIG. 3 that generate the interlayer vias 320A and 320B when the conductive line in the metal layer M7 is projected to the conductive line 326 in the metal layer M1 and the conductive line 322 in the metal layer M2, the interlayer vias 1320A, 1320B and 1320C are generated when the conductive lines 1338A, 1338B and 1338C in the metal layer M3 are projected to conductive line 1322 in the metal layer M2. In this way, each area where the interlayer via 1320A, 1320B or 1320C is disposed is determined by a shape of the conductive line 1338A, 1338B or 1338C in the metal layer M3 projected to the conductive line 1322 in the metal layer M2. As described with reference to FIG. 13B, the width $W_1$ of the conductive line 1338A, 1338b or 1338C is reduced for the width is not determined by the shape of the conductive line in the metal layer M7 projected to the conductive line 1326 in the metal layer M1 and the conductive line 1322 in the metal layer M2. Therefore, the area where the interlayer via 1320A, 1320B or 1320C is disposed has a dimension corresponding to the reduced width.

Figure 13D:
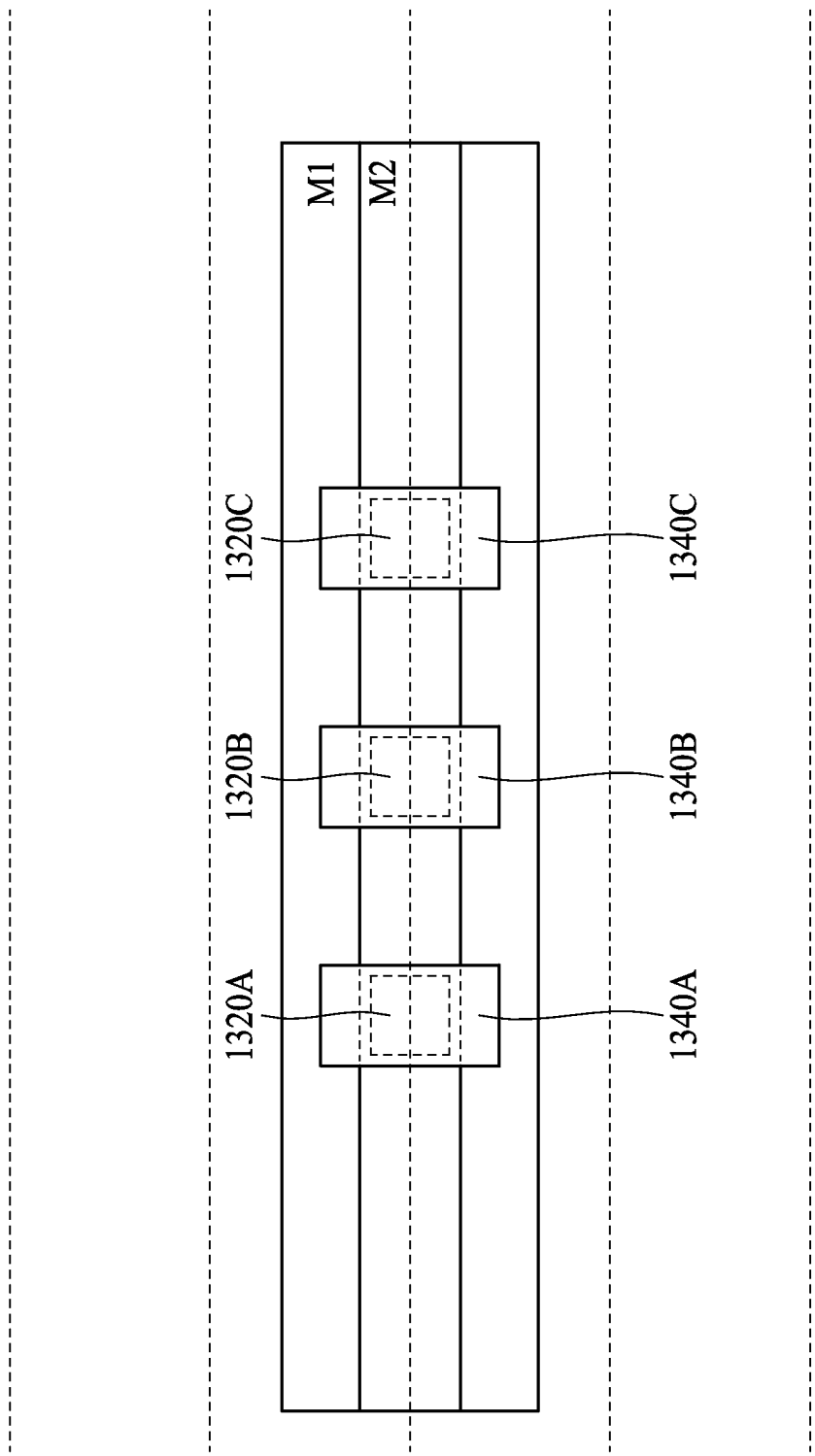
Figure 13E:
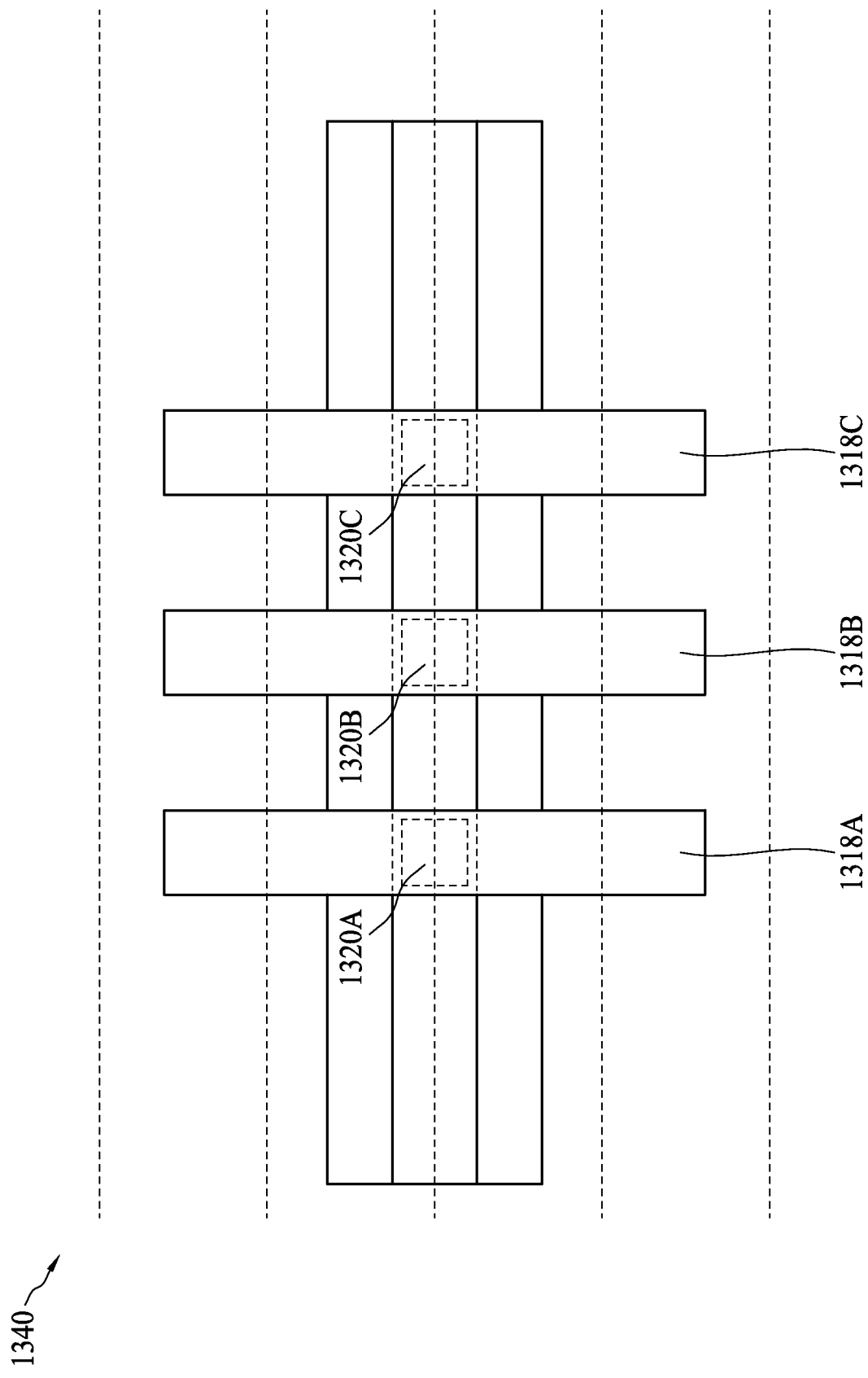

Referring to FIG. 12 and FIGS. 13D and 13E, in operation 1208, for each of the plurality of second conductive lines 1338A, 1338B and 1338C (shown in FIG. 13C), a portion of the second conductive line 1338A, 1338B or 1338C is removed to obtain a plurality of second conductive segments 1318A, 1318B and 1318C (shown in FIG. 13E). The operation 1208 includes a first operation shown in FIG. 13D and a second operation shown in FIG. 13E. Suppose the designer decides that the power network is sufficiently dense without the complete network in the metal layer M3. In the first operation, for each of the plurality of conductive lines 1338A, 1338B and 1338C, portions of the conductive line 1338A, 1338B or 1338C on two sides of the interlayer via 1320A, 1320B or 1320C are removed to obtain a conductive segment 1340A, 1340B or 1340C. However, the remaining conductive segment 1340A, 1340B or 1340C has an area that does not meet the minimum area design rule. Therefore, in the second operation, the area of each of the conductive segment 1340A, 1340B or 1340C is supplemented so that the resulting conductive segment 1318A, 1318B or 1318C meets the minimum area design rule.

Figure 13F:
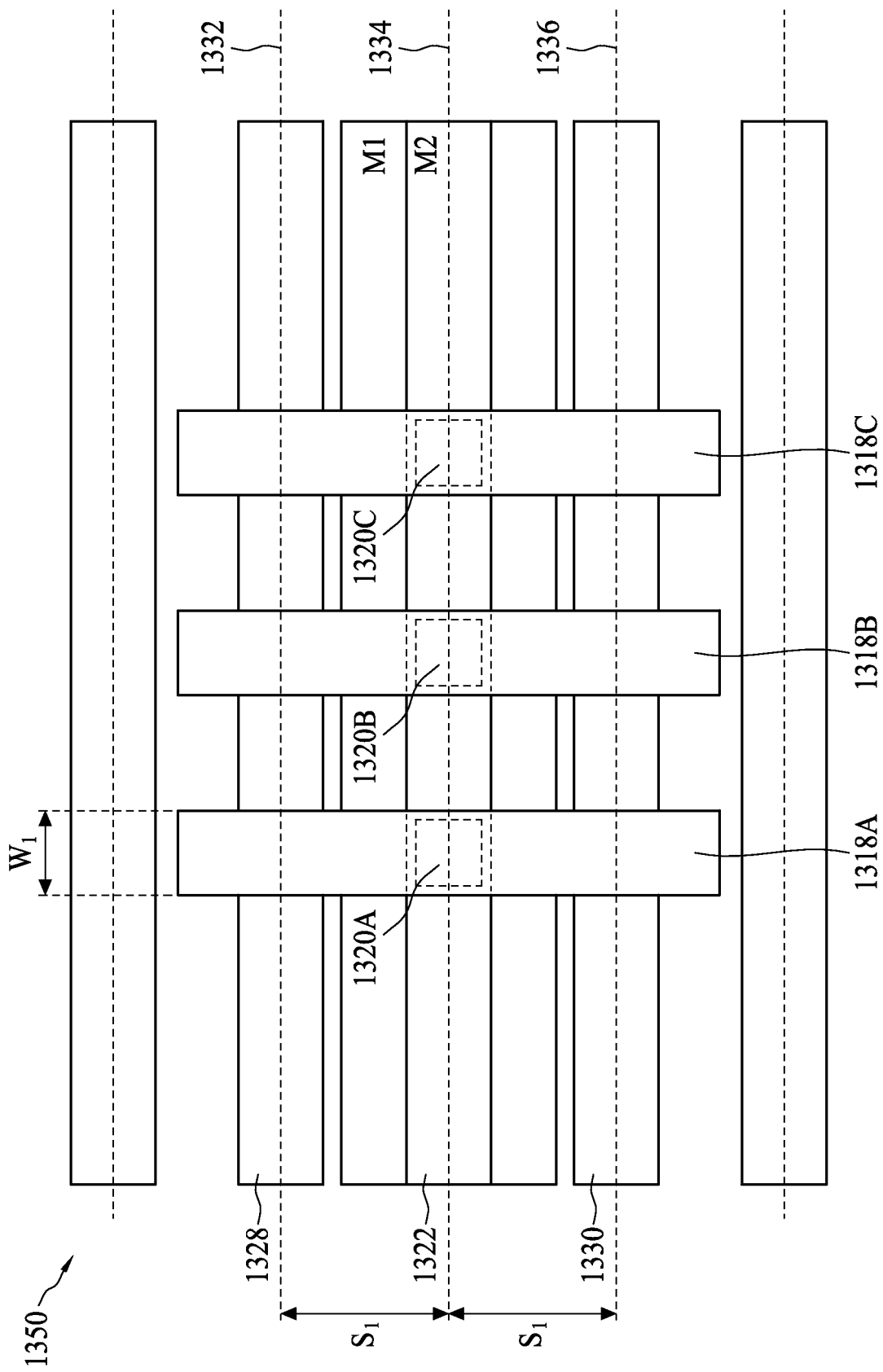

Referring to FIG. 12 and FIG. 13F, in operation 1210, a first adjacent conductive line 1328 or 1330 is generated such that the first conductive line 1322 has a first unit spacing $S_1$ with the first adjacent conductive line 1328 or 1330 in the first conductive layer M2. Because each of the conductive segments 1318A, 1318B and 1318C has the reduced width $W_1$, and each of the interlayer via 1320A, 1320B and 1320C has a shape that conform to the area where the conductive segment 1318A, 1318B or 1318C overlap with the conductive line 1322, the wide metal spacing rule does not apply. Therefore, routing tracks 1332 and 1336 adjacent to the routing track 1334 along which the conductive line 1322 is routed are not blocked and are free to be used during routing of, for example, signal lines. The adjacent conductive lines 1328 or 1330 of the conductive line 1322 can be generated on the routing track 1332 or 1336, respectively, and has the unit spacing $S_1$ with the conductive line 1322. Because the routing resources adjacent to the conductive line 1322 in the metal layer M2 are available for use, fewer routing detours due to insufficient routing resources will happen during generation of signal lines. Therefore, performance and area of the chip on which the method 1200 in FIG. 12 is performed will be improved.

Although FIG. 12 and FIGS. 13A to 13F are directed to the method 1200 for generating the layout for the structure 210 in FIG. 2B, the operations 1202, 1204 to 1208 can also be used to generate the layout for the structure 410 in FIG. 4B. Referring to FIG. 4B, the method for generating the layout for the structure 410 further includes an operation of removing a portion of the first conductive line to obtain a first conductive segment 114. Instead of the operation 1210, the method for generating the layout for the structure 410 includes an operation of generating a second adjacent conductive line 428 such that one of the plurality of second conductive segments, such as the second conductive segment 110A on one side of the plurality of second conductive segments 110A, 110B and 110C, has a second unit spacing $S_2$ with the second adjacent conductive line 428 in the second conductive layer.

Figure 14:
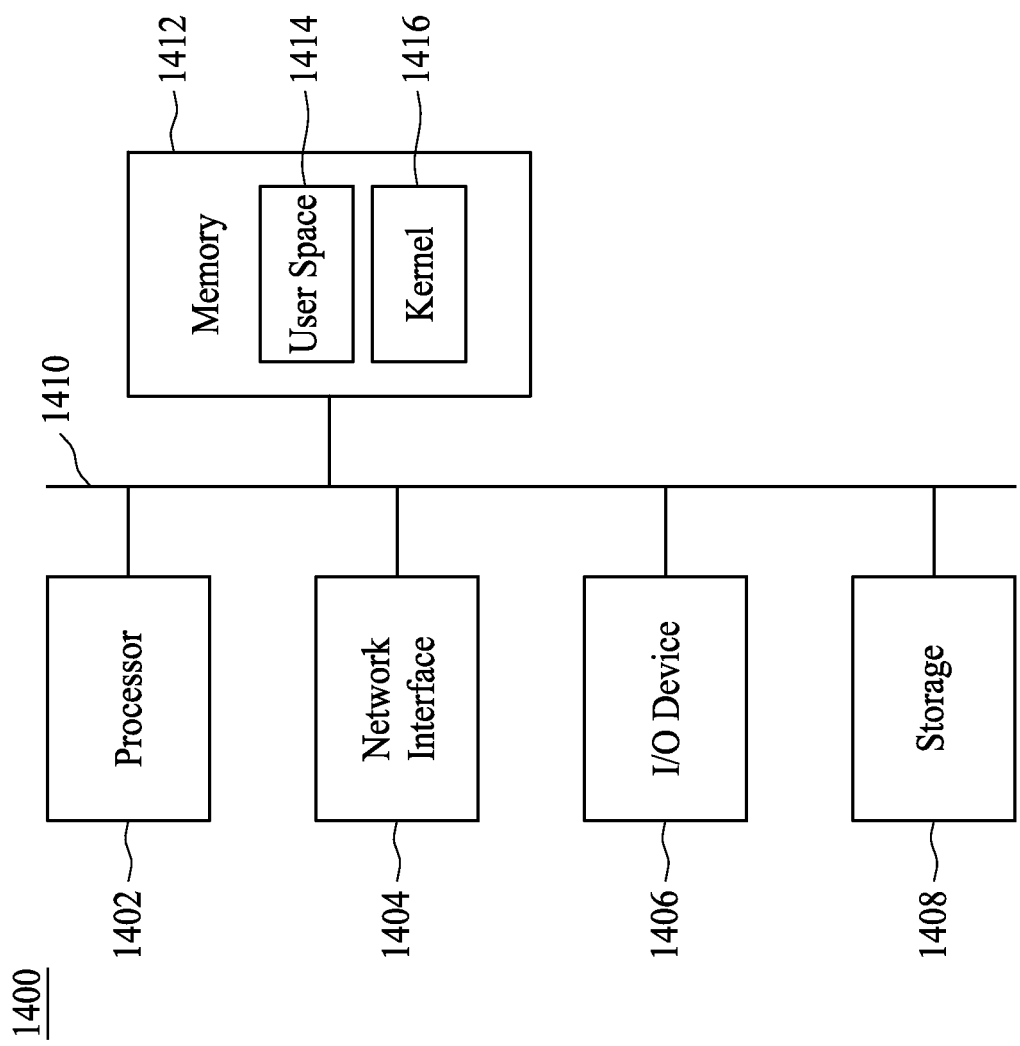
FIG. 14 is a block diagram of a hardware system for implementing method embodiments described with reference to FIGS. 12 and 13A-13F in accordance with some embodiments.

FIG. 14 is a block diagram of a hardware system 1400 for implementing method embodiments described with reference to FIGS. 12 and 13A-13F in accordance with some embodiments. The system 1400 includes at least one processor 1402, a network interface 1404, an input and output (I/O) device 1406, a storage 1408, a memory 1412, and a bus 1410. The bus 1410 couples the network interface 1404, the I/O device 1406, the storage 1408 and the memory 1412 to the processor 1402.

In some embodiments, the memory 1412 comprises a random access memory (RAM) and/or other volatile storage device and/or read only memory (ROM) and/or other non-volatile storage device. The memory 1412 includes a kernel 1414 and user space 1416, configured to store program instructions to be executed by the processor 1402 and data accessed by the program instructions.

In some embodiments, the network interface 1404 is configured to access program instructions and data accessed by the program instructions stored remotely through a network. The I/O device 1406 includes an input device and an output device configured for enabling user interaction with the system 1400. The input device comprises, for example, a keyboard, a mouse, etc. The output device comprises, for example, a display, a printer, etc. The storage device 1408 is configured for storing program instructions and data accessed by the program instructions. The storage device 1408 comprises, for example, a magnetic disk and an optical disk.

In some embodiments, when executing the program instructions, the processor 1402 is configured to perform method embodiments described with reference to FIGS. 12 and 13A to 13F.

In some embodiments, the program instructions are stored in a non-transitory computer readable recording medium such as one or more optical disks, hard disks and non-volatile memory devices.

Some embodiments have one or a combination of the following features and/or advantages. In some embodiments, a fishbone structure in a power network includes substantially orthogonally arranged first conductive line or segment and a plurality of second conductive segments in different conductive layers connected by interlayer vias. In some embodiments, because a shape of the second conductive segment is not determined by projecting a conductive line in a metal layer upper than the second conductive layer to the first conductive line or segment in the first conductive layer or a conductive line in a layer lower than the first conductive layer, each of the plurality of second conductive segments are routed in a preferred direction and has a width such that the wide metal spacing rule does not apply. Therefore, during routing, routing tracks adjacent to the first conductive line or segment in the first conductive layer is available for use. Several routing tracks adjacent to the first or the last second conductive segments in the plurality of second conductive segments are also not blocked from being used. Because the routing resources adjacent to the first conductive line or segment in the first conductive layer and the routing resources adjacent to the first or the last second conductive segments in the plurality of second conductive segments are available for use, fewer routing detours due to insufficient routing resources will happen during generation of signal lines. Therefore, performance and area of the chip will be improved.

In some embodiments, a fishbone structure in a power network includes a first conductive segment in a first conductive layer, a plurality of second conductive segments in a second conductive layer and a first plurality of interlayer vias between the first conductive layer and the second conductive layer. The first conductive segment is running in a first direction. The plurality of second conductive segments are running in a second direction. The second direction is substantially vertical to the first direction. The plurality of second conductive segments overlap with the first conductive segment. The first plurality of interlayer vias are formed at where the plurality of second conductive segments overlap with the first conductive segment. Each of the plurality of second conductive segments has a width such that the first conductive segment has a first unit spacing with a first adjacent conductive line in the first conductive layer or one of the plurality of second conductive segments has a second unit spacing with a second adjacent conductive line in the second conductive layer.

In some embodiments, a fishbone structure in a power network includes a first conductive line in a first conductive layer, a plurality of second conductive segments in a second conductive layer and a first plurality of interlayer vias between the first conductive layer and the second conductive layer. The first conductive line is running in a first direction. The plurality of second conductive segments are running in a second direction. The second direction is substantially vertical to the first direction. The plurality of second conductive segments overlap with the first conductive segment. The first plurality of interlayer vias are formed at where the plurality of second conductive segments overlap with the first conductive line. Each of the plurality of second conductive segments has a width such that the first conductive line has a first unit spacing with a first adjacent conductive line in the first conductive layer or one of the plurality of second conductive segments has a second unit spacing with a second adjacent conductive line in the second conductive layer.

In some embodiments, in a method, a first conductive line in a first conductive layer running in a first direction is generated by at least one processor. A plurality of second conductive lines in a second conductive layer running in a second direction are generated by the at least one processor. The second direction is substantially vertical to the first direction. A first plurality of interlayer vias interposed between the first conductive layer and the second conductive layer are generated at where the plurality of second conductive lines overlap with the first conductive line. Each of the second conductive lines has a width such that a first routing track adjacent to the first conductive line is available for routing or a second routing track adjacent to one of the plurality of second conductive lines is available for routing. For each of the plurality of second conductive lines, a portion of the second conductive line is removed so as to obtain a plurality of second conductive segments The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power network, comprising:
   a first conductive line, a second conductive line, a third conductive line and a fourth conductive line parallel to each other in a first conductive layer, running in a first direction;
   a plurality of fifth conductive lines parallel to each other in a second conductive layer and running in a second direction; and
   wherein the second direction is substantially perpendicular to the first direction;
      each of the fifth conductive lines overlaps with the first conductive line, and a via exists at an area where each of the fifth conductive lines overlaps with the first conductive line, and all other area of each of the fifth conductive lines not overlapping with the first conductive line is free of any via, and a width of each of the fifth conductive lines is a minimum dimension of the second conductive layer with the via, and the first conductive line is continuous where overlapping with each of the fifth conductive lines, wherein the first conductive line is continuous in nature between each region where the first conductive line overlaps with each of the fifth conductive lines;
      at least one of the fifth conductive lines overlaps with the second conductive line, and an area where the at least one fifth conductive line overlaps with the second conductive line is free of any via;
      the fifth conductive lines extend continuously between the third conductive line and the fourth conductive line and are free from overlapping with the third and fourth conductive lines, and a length of each of the fifth conductive lines along the second direction is less than a distance between the third and fourth conductive lines, and a number of the fifth conductive lines is three; and
      the second conductive layer is an upper layer of the first conductive layer.

2. The power network of claim 1, wherein each of the fifth conductive lines has the width such that the first conductive line has a unit spacing with the second conductive line.

3. The power network of claim 2, wherein the second conductive line is between the first conductive line and the third conductive line.

4. The power network of claim 3, further comprising a sixth conductive line between the first conductive line and the fourth conductive line.

5. The power network of claim 4, wherein the sixth conductive line is running in the first direction.

6. The power network of claim 5, wherein at least one of the fifth conductive lines overlaps with the sixth conductive line, and an area where the at least one fifth conductive line overlaps with the sixth conductive line is free of any via.

7. The power network of claim 6, wherein a spacing between the first conductive line and the sixth conductive line is the same as a spacing between the first conductive line and the second conductive line.

8. The power network of claim 7, wherein each of the fifth conductive lines has the width such that the spacing between the first conductive line and the sixth conductive line is a unit spacing.

9. The power network of claim 1, wherein the fifth conductive lines are consecutively arranged.

10. A power network, comprising:
    a first conductive line, a second conductive line and a third conductive line parallel to each other in a first conductive layer and running in a first direction;
    a plurality of fourth conductive lines parallel to each other in a second conductive layer and running in a second direction,
    wherein the second direction is substantially perpendicular to the first direction;
       the plurality of fourth conductive lines overlap with the first conductive line, and a via exists at an area where each of the fourth conductive lines overlaps with the first conductive line, and all other area of each of the fourth conductive lines not overlapping with the first conductive line is free of any via, and a width of each of the fourth conductive lines is a minimum dimension of the second conductive layer with the via, and the first conductive line is continuous where overlapping with each of the fourth conductive lines, wherein the first conductive line is continuous in nature between each region where the first conductive line overlaps with each of the fourth conductive lines;
       the plurality of fourth conductive lines are adjacent to each other in the second conductive layer;
       the fourth conductive lines extend continuously between the second conductive line and the third conductive line and are free from overlapping with the second and third conductive lines, and a length of each of the fourth conductive lines along the second direction is less than a distance between the second and third conductive lines, and a number of the fourth conductive lines is three; and
       the second conductive layer is an upper layer of the first conductive layer.

11. The power network of claim 10, further comprising a fifth conductive line in the first conductive layer and running in the first direction, the fifth conductive line being between the first conductive line and the second conductive line, and the plurality of fourth conductive lines overlap with the fifth conductive line.

12. The power network of claim 11, wherein each of the fourth conductive lines has the width such that the first conductive line has a unit spacing with the fifth conductive line.

13. The power network of claim 11, further comprising a sixth conductive line in the first conductive layer and running in the first direction, the sixth conductive line being between the first conductive line and the third conductive line, and the plurality of fourth conductive lines overlap with the sixth conductive line.

14. A power network, comprising:
a first conductive line, a second conductive line and a third conductive line arranged in a first conductive layer and running in a first direction;
a plurality of fourth conductive lines arranged in a second conductive layer and running in a second direction;
a fifth conductive line in the first conductive layer and running in the first direction, the fifth conductive line being between the first conductive line and the second conductive line, wherein the fourth conductive line overlaps with the fifth conductive line;
wherein the second conductive layer is over the first conductive layer;
the second direction is substantially perpendicular to the first direction; and
the fourth conductive lines overlap with the first conductive line;
an interlayer via is formed between the first conductive layer and the second conductive layer at where each of the fourth conductive lines overlaps with the first conductive line, and all other area of the fourth conductive lines not overlapping with the first conductive line is free of any via, and the first conductive line is continuous where overlapping with the fourth conductive lines, wherein the first conductive line is continuous in nature between each region where the first conductive line overlaps with each of the fourth conductive lines, and
the fourth conductive lines extend continuously between the second conductive line and the third conductive line and are free from overlapping with the second and third conductive lines, and a length of the fourth conductive lines along the second direction is less than a distance between the second and third conductive lines, and a number of the fourth conductive lines is greater than two.

15. The power network of claim 14, wherein an area where each of the fourth conductive lines overlaps with the fifth conductive line is free of any via.

16. The power network of claim 15, wherein a width of each of the fourth conductive lines is a minimum dimension of the second conductive layer with the via.

17. The power network of claim 16, wherein an area where the fourth conductive line overlaps with the fifth conductive line is free of any via.

18. The power network of claim 17, wherein the fourth conductive line has the width such that the first conductive line has a unit spacing with the fifth conductive line.

19. The power network of claim 15, further comprising a sixth conductive line in the first conductive layer and running in the first direction, the sixth conductive line being between the first conductive line and the third conductive line, and the fourth conductive line overlaps with the sixth conductive line.

20. The power network of claim 19, wherein an area where the fourth conductive line overlaps with the sixth conductive line is free of any via.

* * * * *